(12) United States Patent
Sasaki et al.

(10) Patent No.: US 12,336,189 B2
(45) Date of Patent: Jun. 17, 2025

(54) MAGNETIC ARRAY AND METHOD FOR MANUFACTURING MAGNETIC ARRAY

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 512 days.

(21) Appl. No.: 17/520,216

(22) Filed: Nov. 5, 2021

(65) Prior Publication Data

US 2022/0173162 A1    Jun. 2, 2022

(30) Foreign Application Priority Data

Dec. 1, 2020    (JP) ................................. 2020-199587

(51) Int. Cl.
*H10B 61/00*      (2023.01)
*G11C 11/16*      (2006.01)
(Continued)

(52) U.S. Cl.
CPC ............ *H10B 61/22* (2023.02); *G11C 11/161* (2013.01); *G11C 11/1673* (2013.01);
(Continued)

(58) Field of Classification Search
CPC ........ H10B 61/22; H10N 50/80; H10N 50/01; G11C 11/161; G11C 11/1673; G11C 11/1675; G11C 11/1659
(Continued)

(56) References Cited

U.S. PATENT DOCUMENTS

| 8,350,347 B2 | 1/2013 | Gaudin et al. |
| 10,205,088 B2 | 2/2019 | Sasaki et al. |

(Continued)

FOREIGN PATENT DOCUMENTS

| JP | 2005-526351 A | 9/2005 |
| JP | 2014-045196 A | 3/2014 |

(Continued)

OTHER PUBLICATIONS

Y.K.Kato et al. "Observation of the Spin Hal Effect in Semiconductors". Science, 2004, vol. 306, pp. 1910-1913.
(Continued)

*Primary Examiner* — Andres Munoz
*Assistant Examiner* — Ashley Nicole Blackwell
(74) *Attorney, Agent, or Firm* — Oliff PLC

(57) ABSTRACT

This magnetic array includes a substrate, a first unit, a second unit, a word line, a first read line, a second read line, a first gate line, a second gate line, and a source line. Each of the units includes a magnetoresistance effect element, a first switching element, and a second switching element. The magnetoresistance effect element includes a laminate and a wiring provided on the laminate. The first switching element is connected to a reference layer of the laminate. The second switching element is connected to the wiring. Each of the read lines is connected to the first switching element. The word line is connected to the second switching element. The gate lines are respectively connected to the first switching element and the second switching element of different units. The source line is connected to the wiring.

10 Claims, 16 Drawing Sheets

(51) Int. Cl.
H10N 50/01 (2023.01)
H10N 50/80 (2023.01)

(52) U.S. Cl.
CPC ............. H10N 50/01 (2023.02); H10N 50/80 (2023.02); *G11C 11/1675* (2013.01)

(58) Field of Classification Search
USPC ........................................................ 257/427
See application file for complete search history.

(56) References Cited

U.S. PATENT DOCUMENTS

| | | | |
|---|---|---|---|
| 10,490,735 | B2 | 11/2019 | Sasaki |
| 10,608,169 | B2* | 3/2020 | Kim ..................... H10N 52/80 |
| 2001/0008289 | A1 | 7/2001 | Hahn |
| 2006/0056223 | A1 | 3/2006 | Ditewig et al. |
| 2011/0129691 | A1 | 6/2011 | Ishiwata et al. |
| 2012/0020152 | A1 | 1/2012 | Gaudin et al. |
| 2013/0026585 | A1 | 1/2013 | Sung et al. |
| 2014/0017077 | A1 | 1/2014 | Lin |
| 2014/0056060 | A1 | 2/2014 | Khvalkovskiy et al. |
| 2015/0129995 | A1 | 5/2015 | Wang et al. |
| 2015/0248932 | A1* | 9/2015 | Yi ..................... G11C 11/1673 365/148 |
| 2015/0348606 | A1 | 12/2015 | Buhrman et al. |
| 2016/0020207 | A1 | 1/2016 | Tsuchiya et al. |
| 2016/0021468 | A1 | 1/2016 | Karunasiri et al. |
| 2016/0225982 | A1* | 8/2016 | Guo ..................... G11C 11/18 |
| 2016/0359105 | A1 | 12/2016 | Sandhu et al. |
| 2017/0076769 | A1* | 3/2017 | Shirotori ............... H01L 23/528 |
| 2017/0117323 | A1 | 4/2017 | Braganca et al. |
| 2017/0222135 | A1 | 8/2017 | Fukami et al. |
| 2018/0083065 | A1* | 3/2018 | Endo ..................... H10N 50/10 |
| 2018/0158588 | A1 | 6/2018 | Manipatruni et al. |
| 2019/0051820 | A1 | 2/2019 | Sugiyama et al. |
| 2019/0189516 | A1 | 6/2019 | Sasaki et al. |
| 2020/0161542 | A1* | 5/2020 | Ahn ..................... H10N 50/10 |
| 2020/0212104 | A1 | 7/2020 | Sonobe |
| 2020/0341079 | A1 | 10/2020 | Swerts et al. |
| 2022/0310146 | A1* | 9/2022 | Xing ................... G11C 11/1675 |

FOREIGN PATENT DOCUMENTS

| | | |
|---|---|---|
| JP | 5441005 B2 | 3/2014 |
| JP | 2016-021530 A | 2/2016 |
| JP | 2017-059594 A | 3/2017 |
| JP | 2017-216286 A | 12/2017 |
| JP | 2019-033166 A | 2/2019 |
| JP | 6620915 B1 | 12/2019 |
| JP | 2020-107790 A | 7/2020 |
| WO | 2015/041934 A1 | 3/2015 |
| WO | 2015/200003 A1 | 12/2015 |
| WO | 2016/021468 A1 | 2/2016 |
| WO | 2017/052494 A1 | 3/2017 |
| WO | 2018/189964 A1 | 10/2018 |
| WO | 2019/171715 A1 | 9/2019 |

OTHER PUBLICATIONS

I.M. Miron et al. "Perpendicular Switching of a Single Ferromagnetic Layer Induced By In-Plane Current Injection". Nature, 2011, vol. 476, pp. 189-194.

Luqiao Liu et al. "Spin Torque Switching With the Giant Spin Hall Effect of Tantalum". Science, 2012, vol. 336, pp. 555.

Luqiao Liu et al. "Current-Induced Switching of Perpendicularly Magnetized Magnetic Layers Using Spin Torque From the Spin Hall Effect". Physical Review Letters, 2012, vol. 109, pp. 096602.

Ki-Seung Lee et al. "Threshold Current for Switching of a Perpendicular Magnetic Layer Induced By Spin Hall Effect". Applied Physics Letters, 2013, vol. 102, pp. 112410.

Ki-Seung Lee et al. "Thermally Activated Switching of Perpendicular Magnet By Spin-Orbit Spin Torque". Applied Physics Letters, 2014, vol. 104, pp. 072413.

Shunsuke Fukami et al. "Magnetization Switching By Spin-Orbit Torque in an Antiferromagnet-Ferromagnet Bilayer System". Nature Materials, 2016, vol. 15, pp. 535-542.

S. Fukami et al. "A Spin-Orbit Torque Switching Scheme With Collinear Magnetic Easy Axis and Current Configuration". Nature Nanotechnology, 2016.

S. Takahashi et al. "Spin Injection and Detection in Magnetic Nanostructures". Physical Review 3, 2003, vol. 67, pp. 052409.

Yeongkyo Seo et al. "Area-Efficient Sot-Mram With a Schottky Diode". IEEE Electron Device Letters, 2016, vol. 37, No. 8, pp. 982-985.

Wei Zhang et al. "Spin Hall Effects in Metallic Antiferromagnets". Physical Review Letters, 2014, vol. 113, pp. 196602.

H. Sato et al. "Perpendicular-Anisotropy CoFeB—MgO Magnetic Tunnel Junctions With A MgO/CoFeB/Ta/CoFeB/MgO Recording Structure". Applied Physics Letters, 2012, vol. 101, pp. 022414.

Luqiao Liu et al. "Magnetic Oscillations Driven By the Spin Hall Effect in 3-Terminal Magnetic Tunnel Junction Devices". Physical Review Letters, 2012, vol. 109, pp. 186602.

Takashi Kimura et al. "Electrical Control of the Direction of Spin Accumulation". Physical Review Letters, 2007, vol. 99, pp. 166601.

Guoqiang Yu et al. "Switching of Perpendicular Magnetization by Spin-Orbit Torques in the Absence of External Magnetic Fields". Nature Nanotechnology, 2014, vol. 9, pp. 548-554.

Yeongkyo Seo et al. "High-Density Sot-MRAM Based on Shared Bitline Structure". IEEE Transactions on Very Large Scale Integration (VLSI) Systems, 2018, vol. 26, No. 8, pp. 1600-1603.

Translation of Oct. 18, 2022 Office Action issued in Taiwanese Patent Application No. 110143740.

* cited by examiner

MAGNETIC ARRAY AND METHOD FOR MANUFACTURING MAGNETIC ARRAY

FIELD OF THE INVENTION

The present invention relates to a magnetic array and a method for manufacturing a magnetic array.

The present application claims priority on Japanese Patent Application No. 2020-199587 filed on Dec. 1, 2020, the content of which is incorporated herein by reference.

DESCRIPTION OF RELATED ART

Attention is focused on next-generation nonvolatile memories which will replace flash memories and the like for which miniaturization has reached its limit. For example, magnetoresistive random access memories (MRAM), resistance random access memories (ReRAM), phase change random access memories (PCRAM), and the like are known as next-generation nonvolatile memories.

An MRAM is a memory element using a magnetoresistance effect element. A resistance value of a magnetoresistance effect element varies depending on a difference in relative angle between directions of magnetizations of two magnetic films sandwiching a non-magnetic layer therebetween. An MRAM records a resistance value of a magnetoresistance effect element as data.

Regarding spin elements utilizing change in magnetoresistance, attention is focused on spin-orbit torque inagnetoresistance effect elements utilizing a spin-orbit torque (SOT) (for example, Patent Document 1) or magnetic domain wall displacement type magnetic recording elements utilizing displacement of a magnetic domain wall (for example, Patent Document 2).

In three-terminal spin elements, a current path at the time of writing data and a current path at the time of reading data are different from each other. These spin elements require a plurality of transistors to individually control a read current and a write current. Namely, there is a need to secure an area for a plurality of transistors in order to operate one spin element.

PRIOR ART DOCUMENTS

Patent Document

Patent Document 1: Japanese Unexamined Patent Application, First Publication No. 2017-216286
Patent Document 2: Japanese Patent No. 5441005

SUMMARY OF THE INVENTION

Problems to be Solved by the Invention

The present invention has been made in consideration of the foregoing problems, and an object thereof is to provide a magnetic array and a method for manufacturing a magnetic array, in which integration efficiency can be enhanced.

Solutions for Solving the Problems (1) According to a first aspect, there is provided a magnetic array including a substrate, a first unit, a second unit, a word line, a first read line, a second read line, a first gate line, a second gate line, and a source line. Each of the first unit and the second unit includes a magnetoresistance effect element, a first switching element, and a second switching element. The magnetoresistance effect element includes a laminate and a wiring provided on the laminate. The laminate includes at least a reference layer and a non-magnetic layer in order from a substrate side. The first switching element is connected to the reference layer. The second switching element is connected to the wiring. The first read line is connected to the first switching element of the first unit. The second read line is connected to the first switching element of the second unit. The word line is connected to the second switching elements of the first unit and the second unit. The first gate line is connected to a gate of the first switching element of the first unit and a gate of the second switching element of the second unit. The second gate line is connected to a gate of the second switching element of the first unit and a gate of the first switching element of the second unit. The source line is connected to the wiring of the first unit and the wiring of the second unit.

(2) The magnetic array according to the foregoing aspect may further include a comparison unit that is connected to the first read line and the second read line.

(3) In the magnetic array according to the foregoing aspect, a width of the gate of the first switching element may be narrower than a width of the gate of the second switching element.

(4) In the magnetic array according to the foregoing aspect, the first switching element of the first unit and the second switching element of the second unit may be adjacent to each other. The second switching element of the first unit and the first switching element of the second unit may be adjacent to each other.

(5) The magnetic array according to the foregoing aspect may further include an insulating layer that covers a lateral side surface of the laminate, and a first electrode and a second electrode that are provided on the insulating layer. The first electrode and the second electrode may be electrically connected to each other via the wiring.

(6) In the magnetic array according to the foregoing aspect, each of the first electrode and the second electrode may include an underlayer which comes into contact with the wiring.

(7) In the magnetic array according to the foregoing aspect, the underlayer may include the same material as the wiring.

(8) The magnetic array according to the foregoing aspect may further include a first via wiring that is connected to the first electrode, and a second via wiring that is connected to the second electrode. The first via wiring may be provided on an inward side of the first electrode or may come into contact with a lateral side surface of the first electrode. The second via wiring may be provided on an inward side of the second electrode or may come into contact with a lateral side surface of the second electrode.

(9) In the magnetic array according to the foregoing aspect, the laminate may include a free layer, a non-magnetic layer, and a reference layer in order from a substrate side.

(10) In the magnetic array according to the foregoing aspect, the wiring may include a magnetic layer internally including a magnetic domain wall. The laminate may consist of a non-magnetic layer and a reference layer in order from a substrate side.

(11) A method for manufacturing the magnetic array according to the foregoing aspect includes a step of laminating a wiring on a laminate including at least a reference layer and a non-magnetic layer in order from a substrate side; a step of forming an inorganic mask on the wiring and processing the wiring with the mask therebetween; a step of removing the mask, exposing the wiring, and forming an insulating layer such that two different points in the wiring are exposed; and a step of forming a first electrode at one of the two different exposed points in the wiring and forming a second electrode at the other thereof.

Effects of the Invention

The magnetic array according to the foregoing aspect has excellent integration efficiency. In addition, in the method for manufacturing a magnetic array according to the foregoing aspect, a magnetic array having excellent integration efficiency can be produced through few procedures.

DETAILED DESCRIPTION OF THE INVENTION

Figure 1:
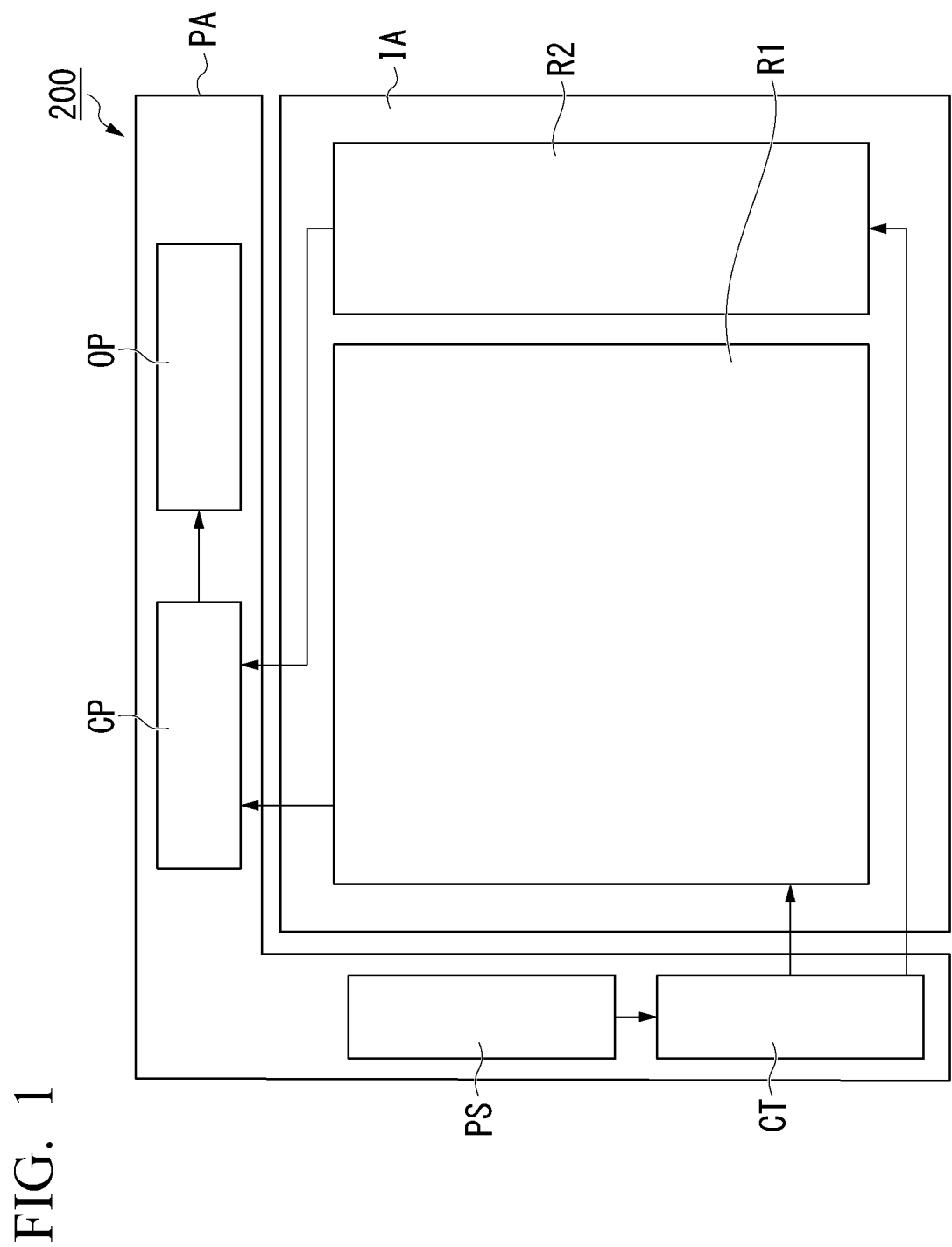
FIG. 1 is a block diagram of a magnetic array according to a first embodiment.

Hereinafter, the present embodiment will be described in detail with reference to the diagrams suitably. In the drawings used in the following description, for the sake of convenience, characteristic portions may be illustrated in an enlarged manner in order to make characteristics easy to understand, and dimensional proportions and the like of constituent elements may be different from those of actual elements. Materials, dimensions, and the like exemplified in the following description are examples. The present invention is not limited thereto and can be suitably changed and performed within a range in which the advantageous effects of the present invention are exhibited.

First, directions will be defined. A direction of a surface of a substrate Sub (refer to FIG. 2) which will be described below is an x direction, and a direction orthogonal to the x direction is a y direction. For example, the x direction is a direction in which a word line WL extends. For example, the y direction is a direction in which a first gate line GL1 and a second gate line GL2 extend. A z direction is a direction which is orthogonal to the x direction and the y direction. In the z direction, a direction from the substrate Sub toward laminates 10 and 30 will be referred to as a positive z (+z) direction. Hereinafter, the positive z direction may be expressed as "upward", and a negative z (−z) direction may be expressed as "downward". The upward and downward directions do not necessarily coincide with a direction in which a gravitational force is applied.

In addition, in this specification, the term "connect" is not limited to a case in which two objects directly come into contact with each other. For example, the term "connect" also includes a case of being indirectly connected to each other with another structure therebetween and a case in which two objects are electrically connected to each other. In addition, the expression "extend in the x direction" means that a length in the x direction is longer than a length in other directions.

First Embodiment

FIG. 1 is a block diagram of a magnetic array 200 according to a first embodiment. The magnetic array 200 includes an integrated area IA and a peripheral area PA.

For example, the integrated area IA includes a first region R1 and a second region R2. The first region R1 is an area in which recording cells for recording data are integrated. The second region R2 is an area in which reference cells used for comparison with the recording cells are integrated. The recording cells are cells in which data is recorded and held. The reference cells are cells serving as indices for determining whether appropriate data is recorded in the recording cells. When integration efficiency inside the integrated area IA increases, a recording density of the magnetic array 200 increases.

The peripheral area PA is an area in which a control element for controlling operation of the cells within the integrated area IA is mounted. For example, the peripheral area PA is provided on an outward side of the integrated area IA. For example, the peripheral area PA includes a power supply PS, a control part CT, a comparison unit CP, and a calculation unit OP.

The power supply PS outputs a voltage or a current applied to the cells. The control part CT designates an address of a cell to which a voltage or a current is applied. The comparison unit CP compares the recording cells and the reference cells to each other. The recording cells and the reference cells have similar constitutions, and similar data is recorded therein in principle. The comparison unit CP determines that some kind of failure has occurred in a recording cell when there is a large discrepancy in data therebetween. The comparison unit CP is connected to a first read line RL1 and a second read line RL2, which will be described below. The calculation unit OP outputs and inputs data on the basis of results compared and output by the comparison unit CP.

Figure 2:
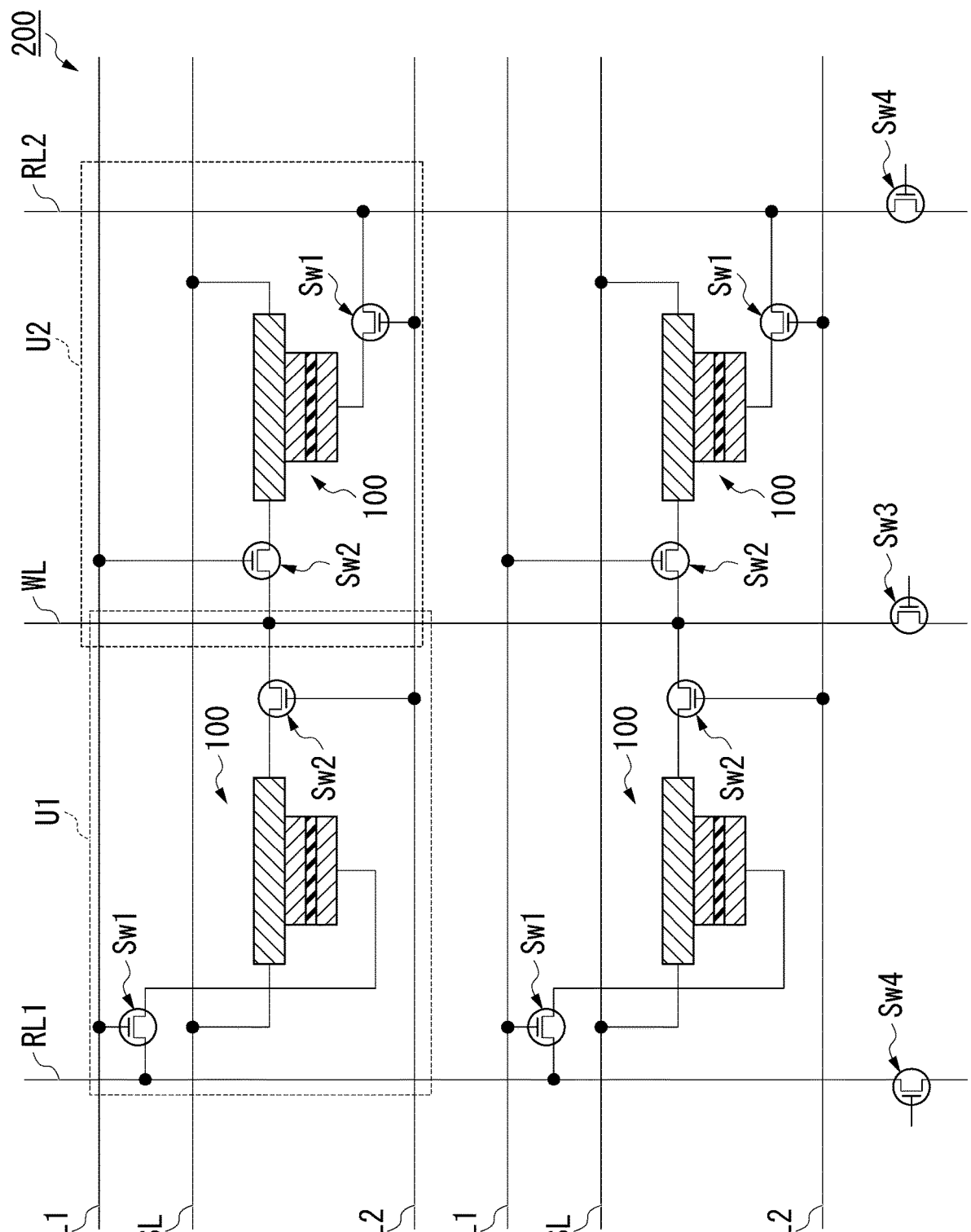
FIG. 2 is a circuit diagram of a portion of the magnetic array according to the first embodiment.

FIG. 2 is a circuit diagram of a portion of the magnetic array 200 according to the first embodiment. For example, FIG. 2 is a circuit diagram of the first region R1 in which a plurality of recording cells are integrated. A circuit diagram of the second region R2 is also similar to the circuit diagram of the first region R1.

For example, the magnetic array 200 includes a first unit U1, a second unit U2, the word line WL, the first read line RL1, the second read line RL2, the first gate line GL1, the second gate line GL2, a source line SL, a third switching element Sw3, and a fourth switching element Sw4.

Each of the first unit U1 and the second unit U2 is a unit including a magnetoresistance effect element 100, a first switching element Sw1, and a second switching element Sw2. For example, these units are arrayed in a matrix state. The number of units does not particularly matter. For example, the first unit U1 and the second unit U2 are adjacent to each other in a column direction and share the word line WL.

Each of the first switching element Sw1, the second switching element Sw2, the third switching element Sw3, and the fourth switching element Sw4 is an element for controlling a flow of a current. For example, they may be field effect transistors. For example, the switching elements may be elements which utilize phase change in a crystal layer, such as an ovonic threshold switch (OTS), elements which utilize change in a band structure, such as a metal-insulator transition (MIT) switch, elements which utilize a breakdown voltage, such as a Zener diode and an avalanche diode, or elements in which conductivity changes in accordance with change in atomic position.

For example, the word line WL is connected to the second switching elements Sw2 of the first unit U1 and the second unit U2. The word line WL is a wiring in which a write current flows when data is written in the magnetoresistance effect element 100.

For example, the first read line RL1 is connected to the first switching element Sw1 which belongs to the first unit U1. The first read line RL1 is a wiring in which a read current flows when data is read from the magnetoresistance effect element 100 which belongs to the first unit U1. For example, the second read line RL2 is connected to the first switching element Sw1 which belongs to the second unit U2. The second read line RL2 is a wiring in which a read current flows when data is read from the magnetoresistance effect element 100 which belongs to the second unit U2.

The first gate line GL1 is connected to the first switching element Sw1 of the first unit U1 and the second switching element Sw2 of the second unit U2. The second gate line GL2 is connected to the second switching element Sw2 of the first unit U1 and the first switching element Sw1 of the second unit U2. The first gate line GL1 and the second gate line GL2 are connected to gates G for controlling ON/OFF operation of the first switching element Sw1 and the second switching element Sw2.

The source line SL is a wiring in which a write current and a read current flow and is connected to a reference electric potential. For example, the reference electric potential is the ground. The source line SL is connected to wirings 20 of the first unit U1 and the second unit U2, which will be described below. A flowing direction of a write current varies depending on an electric potential of the source line SL with respect to the reference electric potential.

When data is written in the magnetoresistance effect element 100, the first switching element Sw1 of a unit of an address designated by the control part CT is turned off, and the second switching element Sw2 is turned on. For example, ON/OFF operation of the first switching element Sw1 and the second switching element Sw2 is controlled by changing the electric potentials of the first gate line GL1 and the second gate line GL2. Further, when the third switching element Sw3 is turned on, a write current flows between the word line WL and the source line SL leading to the magnetoresistance effect element 100 of the designated address. A resistance value of the magnetoresistance effect element 100 varies depending on the write current. The magnetoresistance effect element 100 records data as a resistance value. Data of the magnetoresistance effect element 100 can be rewritten depending on the flowing direction of a write current.

When data is read from the magnetoresistance effect element 100, the first switching element Sw1 of a unit of an address designated by the control part CT is turned on, and the second switching element Sw2 is turned off. Further, when the fourth switching element Sw4 is turned on, a read current flows between the first read line RL1 or the second read line RL2 and the source line SL leading to the magnetoresistance effect element 100 of the designated address. A magnitude of a read current output from the source line SL varies depending on the resistance value of the magnetoresistance effect element 100. That is, data recorded in the magnetoresistance effect element 100 (the resistance value) is converted into a read current and is read.

Figure 3:
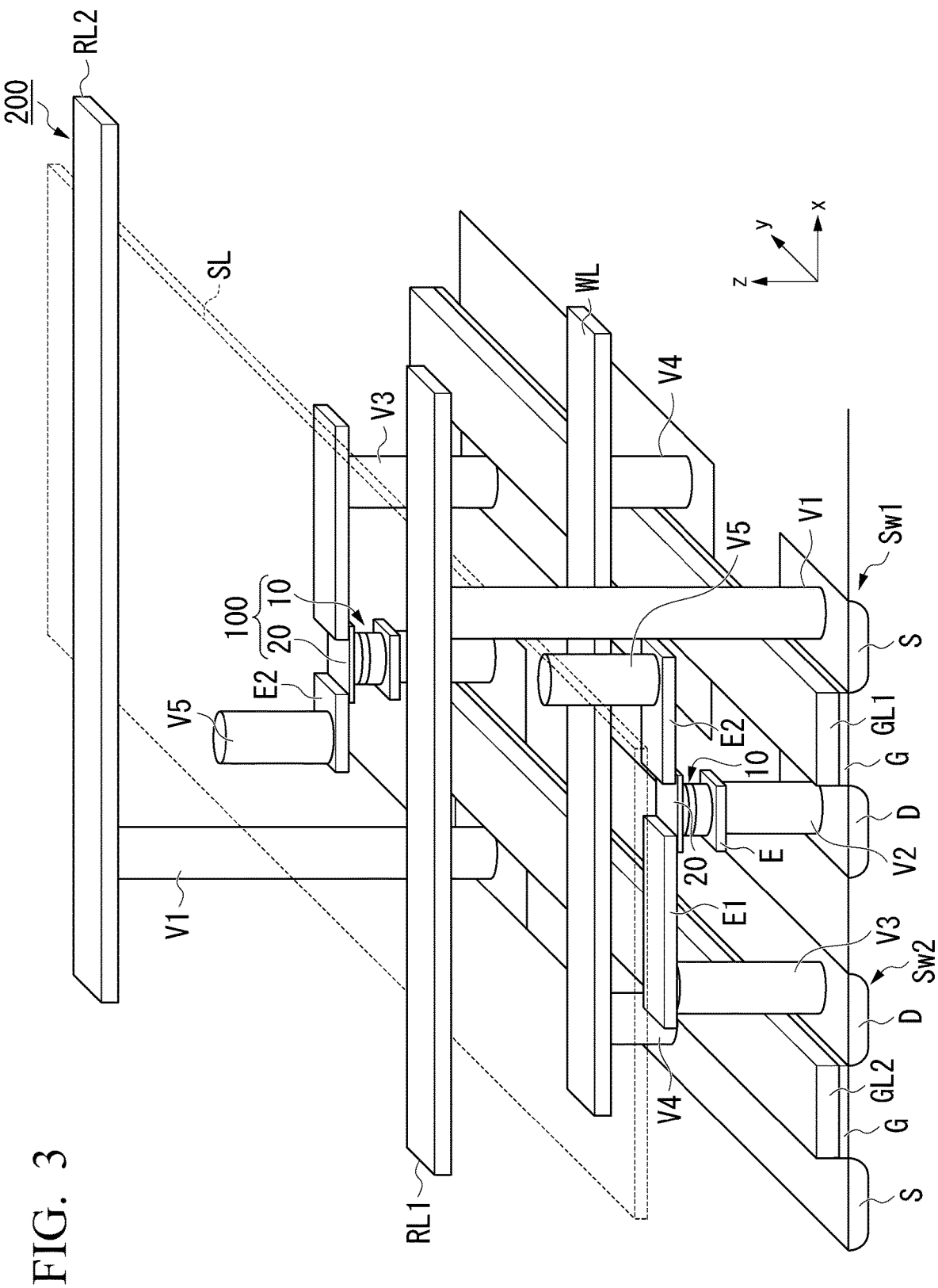
FIG. 3 is a perspective view of a portion of the magnetic array according to the first embodiment.
Figure 4:
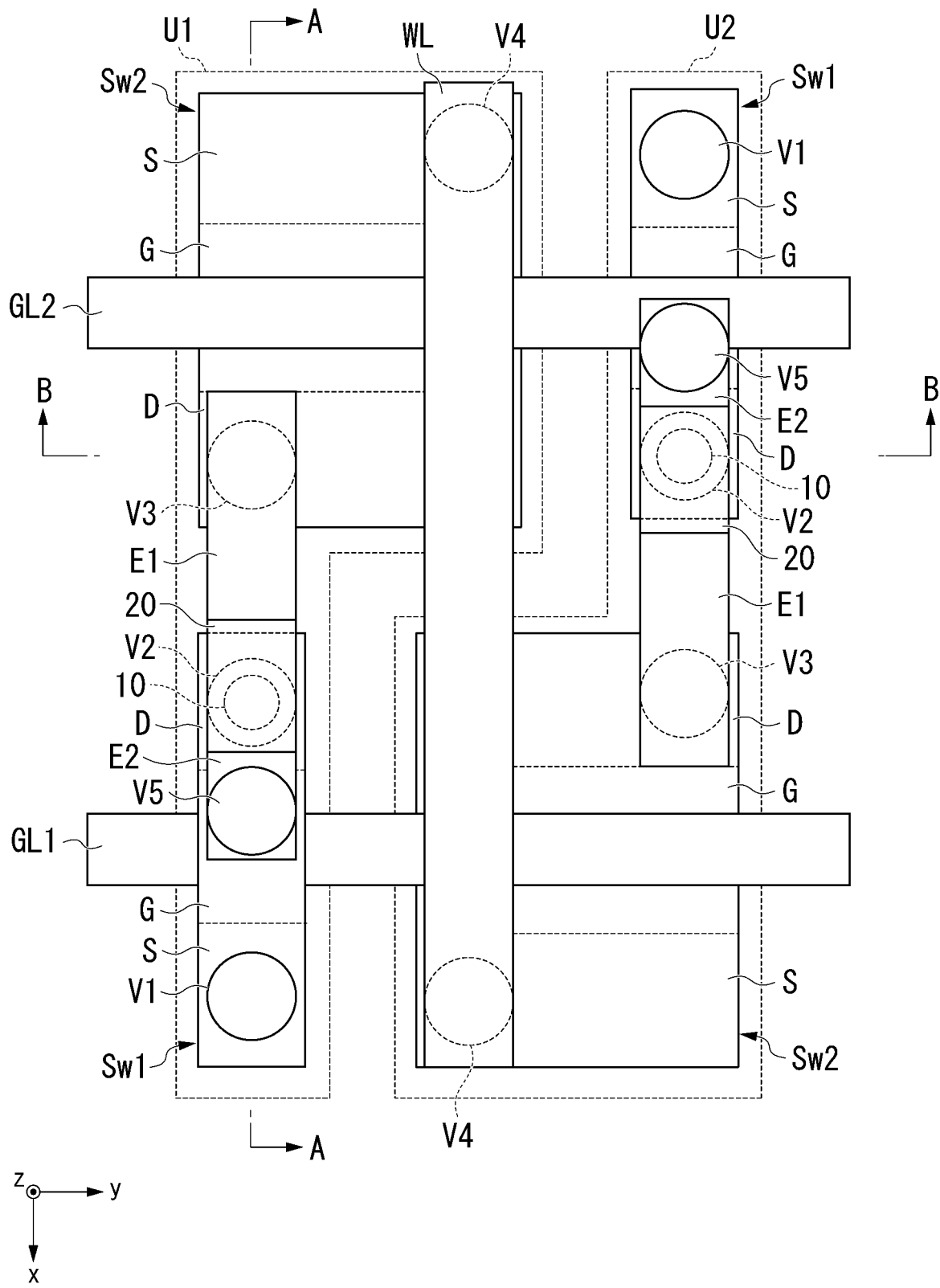
FIG. 4 is a plan view of a portion of the magnetic array according to the first embodiment.
Figure 5:
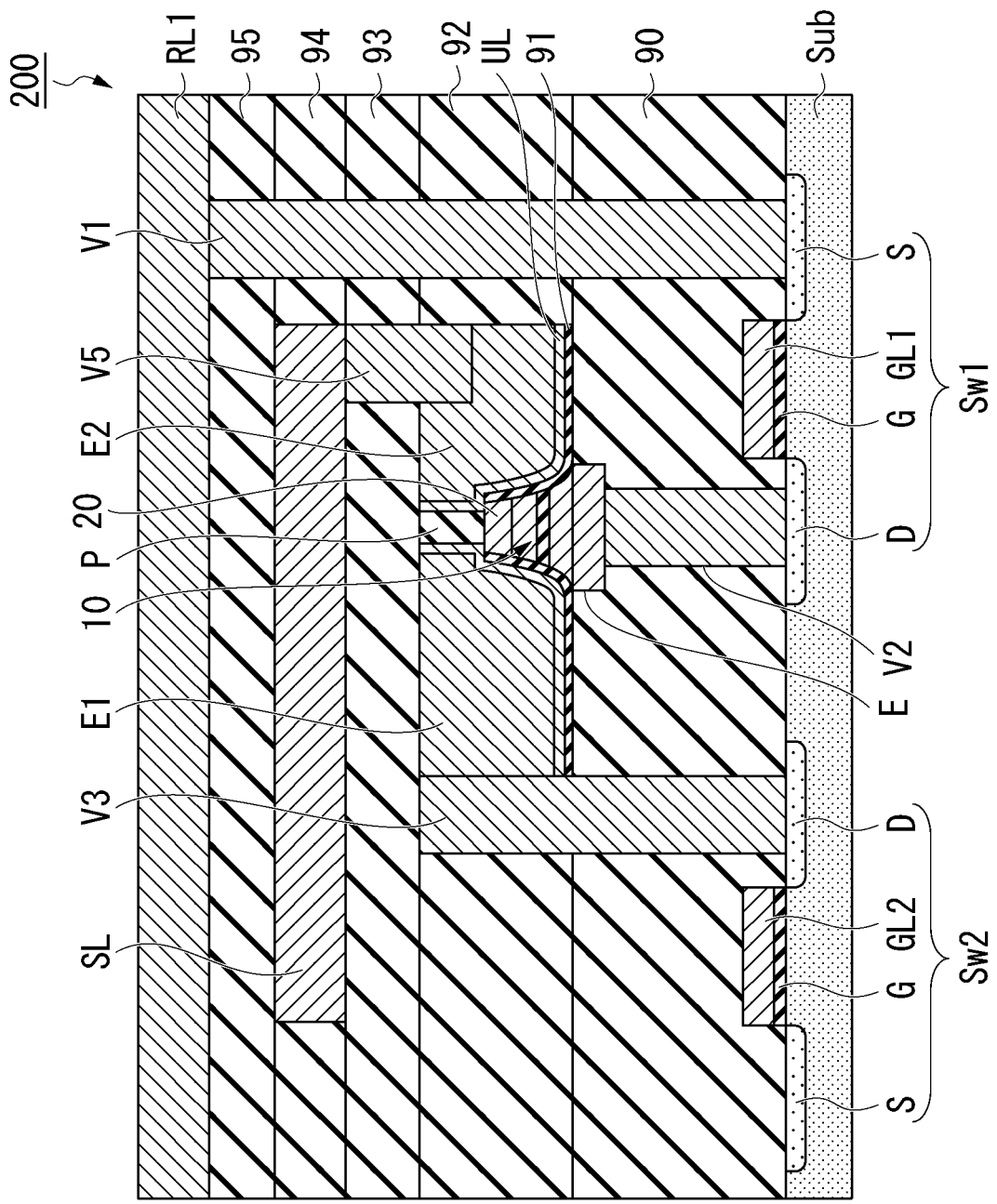
FIG. 5 is a cross-sectional view of a portion of the magnetic array according to the first embodiment.
Figure 6:
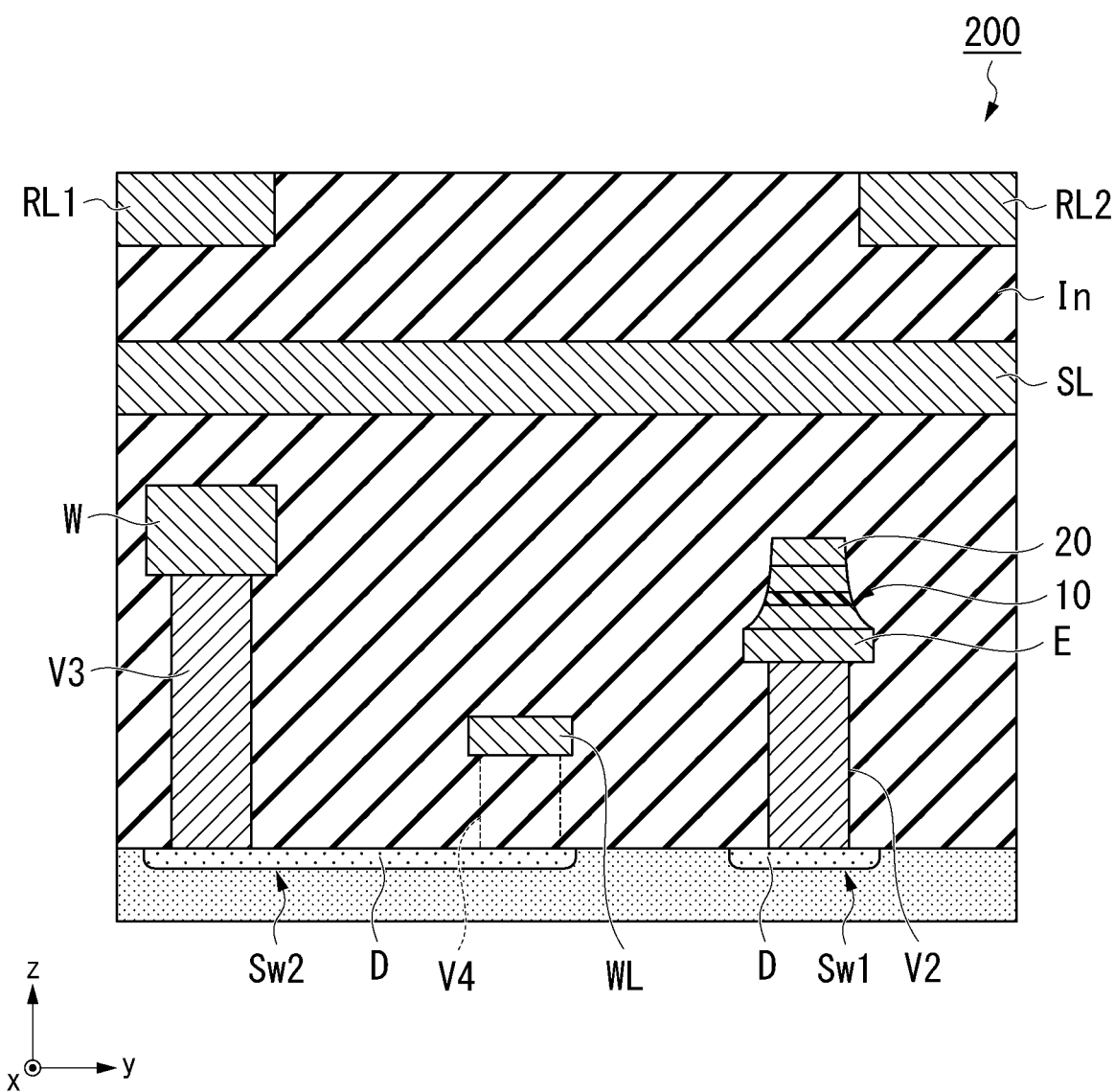
FIG. 6 is another cross-sectional view of a portion of the magnetic array according to the first embodiment.

FIG. 3 is a perspective view of a portion of the magnetic array 200 according to the first embodiment. In FIG. 3, the source line SL is indicated by dotted lines such that the internal structure can be easily seen. FIG. 4 is a plan view of a portion of the magnetic array 200 according to the first embodiment. In FIG. 4, in order to facilitate understanding, the source line SL, the first read line RL1, and the second read line RL2 are omitted. FIGS. 5 and 6 are cross-sectional views of portions of the magnetic array 200 according to the first embodiment. FIG. 5 is a cross-section along line A-A in FIG. 4, and FIG. 6 is a cross-section along line B-B in FIG. 4. In FIGS. 3 to 6, the first switching element Sw1 and the second switching element Sw2 are field effect transistors.

The word line WL, the first read line RL1, the second read line RL2, the first gate line GL1, the second gate line GL2, the source line SL, and the magnetoresistance effect element 100 are laminated on the substrate Sub in a three-dimensional manner. These elements are electrically separated from each other due to insulating layers 90, 92, 93, 94, and 95 excluding via wirings V1, V2, V3, V4, and V5 extending in the z direction.

The insulating layers 90, 92, 93, 94, and 95 are insulating layers for insulating wirings or elements of a multi-layer wiring from each other. For example, the insulating layers 90, 92, 93, 94, and 95 are made of silicon oxide ($SiO_x$), silicon nitride ($SiN_s$), silicon carbide (SiC), chromium nitride, silicon carbonitride (SiCN), silicon oxynitride (SiON), aluminum oxide ($Al_2O_3$), zirconium oxide ($ZrO_x$), or the like.

The first switching element Sw1 and the second switching element Sw2 are formed on the substrate Sub. For example, each of the first switching element Sw1 and the second switching element Sw2 includes a source S, a drain D, and the gate G. The source S and the drain D are established in accordance with a flowing direction of a current, and these are in the same area. FIGS. 3 to 6 merely illustrate examples, and the positional relationships between the source S and the drain D may be individually reversed. In addition, in the specification, the source S can be reworded as the drain D, and the drain D can be reworded as the source S. The gate G is a part carrying out ON/OFF operation of the first switching element Sw1 and the second switching element Sw2. For example, the gate G is an insulating layer between the first gate line GL1 or the second gate line GL2 and the substrate Sub.

For example, the source S of the first switching element Sw1 is connected to the first read line RL1 or the second read line RL2 via the via wiring V1. For example, the drain D of the first switching element Sw1 is connected to a laminate 10 via the via wiring V2 and an electrode E. The gate G of the first switching element Sw1 is connected to the first gate line GL1. When a voltage is applied to the first gate line GL1, a channel is formed between the source S and the drain D, and the first switching element Sw1 is turned on.

For example, the source S of the second switching element Sw2 is connected to the word line WL via the via wiring V4. For example, the drain D of the second switching element Sw2 is connected to a first end of the wiring 20 via the via wiring V3 and a first electrode E1. A second end of the wiring 20 is connected to the source line SL via a second electrode E2 and the via wiring V5. The gate G of the second switching element Sw2 is connected to the second gate line GL2. When a voltage is applied to the second gate line GL2, a channel is formed between the source S and the drain D, and the second switching element Sw2 is turned on.

For example, the first switching element Sw1 is smaller than the second switching element Sw2. The reason for this is that a read current controlled by the first switching element Sw1 is smaller than a write current controlled by the second switching element Sw2. That is, the largest amount of a current flowing in the first switching element Sw1 may be designed to be smaller than the largest amount of a current flowing in the second switching element Sw2. For example, the width of the first switching element Sw1 is narrower than the width of the second switching element Sw2. The width of the switching element is a width in a direction orthogonal to a straight line connecting the source S and the drain D to each other. For example, it is a width of the gate G in the y direction. Adjustment of the largest amount of a current flowing in the switching element can be realized through design of the width of the gate G in the y direction. In addition, similar effects can also be achieved by installing a plurality of switching elements in parallel and increasing the effective width of the gate. For example, a FinFET has a structure in which an inversion area of a channel layer can be increased by applying a gate voltage to a lateral side wall of the channel layer so that a large current can flow. When FinFETs are used as switching elements, a larger current can be obtained if the switching elements are arranged in parallel, and thus effects similar to a case of increasing the effective width of the gate can be achieved.

For example, the first switching element Sw1 and the second switching element Sw2 are alternately arrayed on the substrate Sub. For example, the first unit U1 and the second unit U2 are adjacent to each other in the y direction. Each of the first unit U1 and the second unit U2 is within an area covering outer circumferences of the first switching element Sw1 and the second switching element Sw2. For example, the first switching element Sw1 of the first unit U1 and the second switching element Sw2 of the second unit U2 are adjacent to each other in the y direction. In addition, for example, the second switching element Sw2 of the first unit U1 and the first switching element Sw1 of the second unit U2 are adjacent to each other in the y direction. The first unit U1 and the second unit U2 have a positional relationship in which the first switching element Sw1 and the second switching element Sw2 are opposite to each other, and the first unit U1 and the second unit U2 have a point-symmetrical relationship. A part of the second unit U2 having a wide width in the y direction is fitted to a part of the first unit U1 having a narrow width in the y direction, and thus integration efficiency of the first unit U1 and the second unit U2 increases.

The via wirings V1, V2, V3, V4, and V5 connect elements in different layers divided in the z direction by the insulating layers 90, 92, 93, 94, and 95. The via wiring V1 connects the first read line RL1 or the second read line to the first switching element Sw1. The via wiring V2 connects the first switching element Sw1 and the magnetoresistance effect element 100 to each other. The via wiring V3 connects the second switching element Sw2 and the magnetoresistance effect element 100 to each other. The via wiring V4 connects the second switching element Sw2 and the word line WL to each other. The via wiring V5 connects the source line SL and the magnetoresistance effect element 100 to each other.

Figure 7:
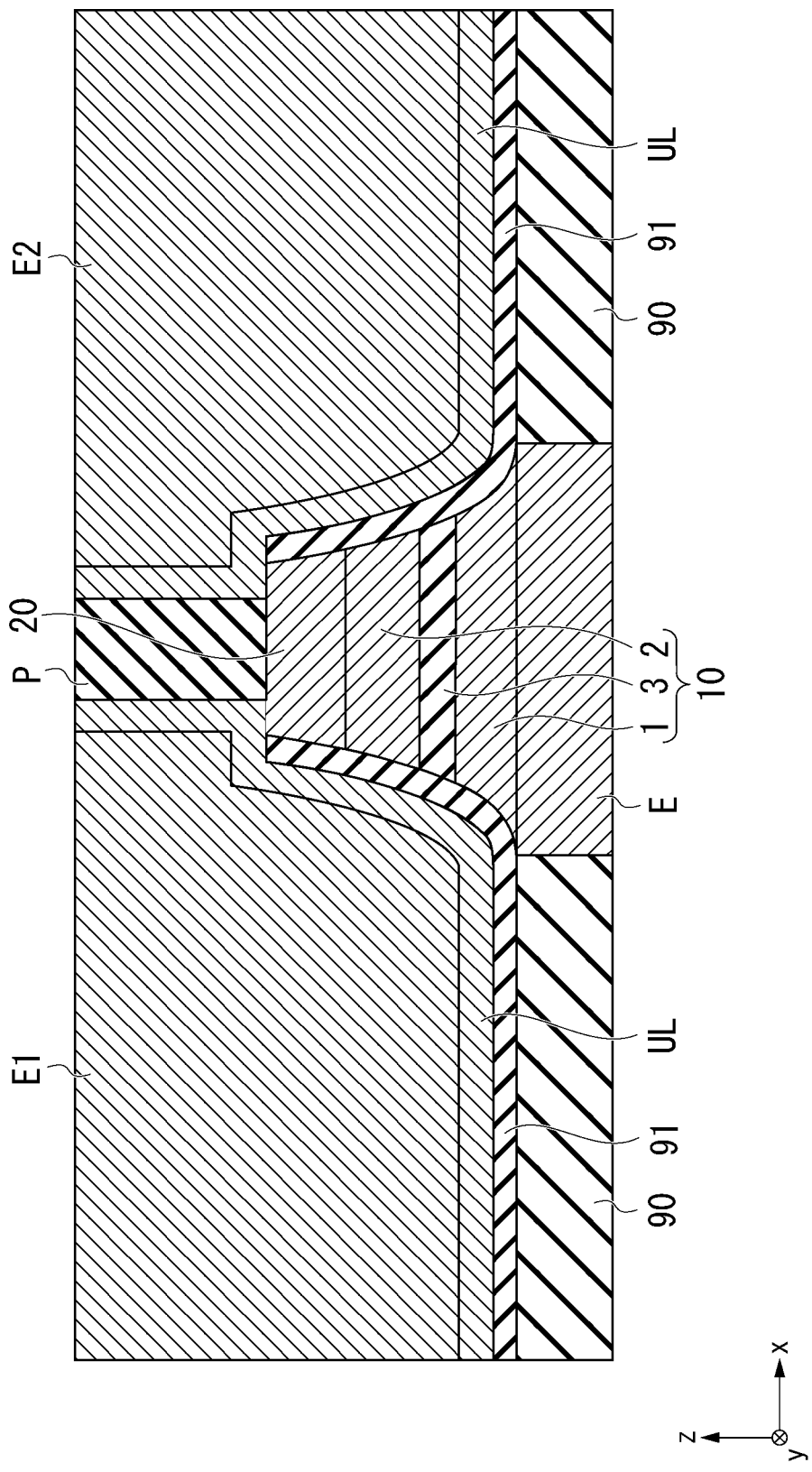
FIG. 7 is a cross-sectional view in the vicinity of a magnetoresistance effect element of the magnetic array according to the first embodiment.

FIG. 7 is a cross-sectional view in the vicinity of the magnetoresistance effect element 100 of the magnetic array 200 according to the first embodiment. FIG. 7 is a cross-section along line A-A in FIG. 4. The magnetoresistance effect element 100 includes the laminate 10 and the wiring 20. The magnetoresistance effect element 100 is a spin element utilizing spin-orbit torque (SOT) and may be referred to as a spin-orbit torque magnetoresistance effect element, a spin-injection magnetoresistance effect element, or a spin-current magnetoresistance effect element. In addition, the wiring 20 may be referred to as a spin-orbit torque wiring.

The laminate 10 is a pillar body. For example, the shape of the laminate 10 in a plan view in the z direction may be a circular shape, an elliptical shape, or a quadrangular shape. For example, the laminate 10 is provided on the electrode E. For example, the wiring 20 is on the laminate 10.

The laminate 10 includes a first ferromagnetic layer 1, a non-magnetic layer 3, and a second ferromagnetic layer 2 in order from a substrate Sub side. The first ferromagnetic layer 1 and the second ferromagnetic layer 2 sandwich the non-magnetic layer 3 therebetween in the z direction. The first ferromagnetic layer 1 is connected to the drain D of the first switching element Sw1 via the electrode E.

Each of the first ferromagnetic layer 1 and the second ferromagnetic layer 2 has a magnetization. The orientation direction of the magnetization of the first ferromagnetic layer 1 is less likely to vary than that of the magnetization of the second ferromagnetic layer 2 when a predetermined external force is applied thereto. The first ferromagnetic layer 1 is referred to as a fixed layer or a reference layer, and the second ferromagnetic layer 2 is referred to as a free layer. The resistance value of the laminate 10 varies depending on a difference in relative angle between the magnetizations of the first ferromagnetic layer 1 and the second ferromagnetic layer 2 sandwiching the non-magnetic layer 3 therebetween. The magnetoresistance effect element 100 stores and outputs this resistance value as data.

The first ferromagnetic layer 1 and the second ferromagnetic layer 2 include a ferromagnetic substance. For example, a ferromagnetic substance is a metal selected from the group consisting of Cr, Mn, Co, Fe, and Ni, an alloy including one or more of these metals, an alloy including these metals and at least one or more elements of B, C, and N, or the like. For example, a ferromagnetic substance is a Co—Fe, Co—Fe—B, Ni—Fe, or Co—Ho alloy, a Sm—Fe alloy, a Fe—Pt alloy, a Co—Pt alloy, or a CoCrPt alloy.

The first ferromagnetic layer 1 and the second ferromagnetic layer 2 may include a Heusler alloy. A Heusler alloy includes an intermetallic compound having a chemical composition of XYZ or $X_2YZ$. X represents a Co-, Fe-, Ni-, or Cu-group transition metal element or a precious metal element in the periodic table. Y represents a Mn-, V-, Cr-, or Ti-group transition metal or an element represented by X. Z is a typical element of Group III to Group V. For example, a Heusler alloy represents $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. A Heusler alloy has a high spin polarization.

The laminate 10 may include an antiferromagnetic layer between the first ferromagnetic layer 1 and the electrode E with a spacer layer therebetween. The first ferromagnetic layer 1, the spacer layer, and the antiferromagnetic layer constitute a synthetic antiferromagnetic structure (SAF structure). The synthetic antiferromagnetic structure consists of two magnetic layers sandwiching a non-magnetic layer therebetween. Due to antiferromagnetic coupling between the first ferromagnetic layer 1 and the antiferromagnetic layer, the first ferromagnetic layer 1 has a large coercivity compared to a case of having no antiferromagnetic layer. For example, the antiferromagnetic layer is made of IrMn, PtMn, or the like. For example, the spacer layer includes at least one selected from the group consisting of Ru, Ir, and Rh.

The laminate 10 may include another layer in addition to the first ferromagnetic layer 1, the second ferromagnetic layer 2, and the non-magnetic layer 3. For example, the laminate 10 may include an underlayer under the first ferromagnetic layer 1. An underlayer enhances crystallinity of each of the layers constituting the laminate 10. In addition, for example, the laminate 10 may include a cap layer on the second ferromagnetic layer 2.

The wiring 20 is provided on the laminate 10. For example, the wiring 20 comes into contact with the second ferromagnetic layer 2 of the laminate 10. The wiring 20 generates a spin current due to a spin Hall effect occurring when a current flows between the first electrode E1 and the second electrode E2 and injects spins into the second ferromagnetic layer 2. For example, the wiring 20 applies as much spin-orbit torque (SOT) as the magnetization of the second ferromagnetic layer 2 can be reversed to the magnetization of the second ferromagnetic layer 2.

The spin Hall effect is a phenomenon in which a spin current is induced in a direction orthogonal to the flowing direction of a current on the basis of a spin-orbit interaction occurring when a current flows. A spin Hall effect and a normal Hall effect are the same in that a movement (traveling) direction of moving (traveling) charges (electrons) is bent. In a normal Hall effect, the moving direction of charged particles moving in a magnetic field is bent due to a Lorentz force. In contrast, in a spin Hall effect, the traveling direction of spins is bent only due to traveling electrons (only due to flowing currents) even if there is no magnetic field.

For example, when a current flows in the x direction of the wiring 20, first spins oriented in a negative y (−y) direction are bent in the positive z (+z) direction, and second spins oriented in a positive y (+y) direction are bent in the negative z (−z) direction. In a nonmagnetic substance (a material that is not a ferromagnetic substance), the number of electrons in the first spins generated due to a spin Hall effect and the number of electrons in the second spins are equivalent to each other. That is, the number of electrons in the first spins in the positive z (+z) direction and the number of electrons in the second spins in the negative z (−z) direction are equivalent to each other. The first spins and the second spins flow in directions in which uneven distribution of spins is eliminated. In traveling of the first spins and the second spins in the z direction, since flows of charges cancel each other, the current amount becomes zero. A spin current without a current is particularly referred to as a pure spin current.

When a flow of electrons in the first spins is expressed as $J_\uparrow$, a flow of electrons in the second spins is expressed as $J_\downarrow$, and a spin current is expressed as $J_S$, they are defined as $J_S=J_\uparrow-J_\downarrow$. The spin current $J_S$ is generated in the z direction. The first spins are injected into the second ferromagnetic layer 2 from the wiring 20.

The wiring 20 includes any of a metal, an alloy, an intermetallic compound, metal boride, metal carbide, metal silicide, and metal phosphide having a function of generating a spin current due to a spin Hall effect occurring when a current flows between the first electrode E1 and the second electrode E2.

For example, the wiring 20 includes a nonmagnetic heavy metal as a main element. The main element indicates an element having the highest proportion among elements constituting the wiring 20. For example, the wiring 20 includes a heavy metal having a specific weight equal to or greater than that of yttrium (Y). Since a nonmagnetic heavy metal has a high atomic number (atomic number 39 or higher) and has d electrons or f electrons in an outermost shell, a strong spin-orbit interaction occurs. A spin Hall effect occurs due to a spin-orbit interaction, spins are likely to be unevenly distributed inside the wiring 20, and the spin current $J_S$ is likely to be generated. For example, the wiring 20 includes any one selected from the group consisting of Au, Hf, Mo, Pt, W, and Ta.

The wiring 20 may include a magnetic metal. A magnetic metal is a ferromagnetic metal or an antiferromagnetic metal. A slight amount of a magnetic metal included in a nonmagnetic substance becomes a scattering factor of spins. For example, a slight amount indicates an amount equal to or less than 3% of the total mole ratio of the elements constituting the wiring 20. When spins scatter due to a magnetic metal, a spin-orbit interaction is enhanced, and thus generation efficiency of a spin current with respect to a current increases.

The wiring 20 may include a topological insulator. A topological insulator is a substance of which the interior is an insulator or a high-resistance body and is a substance in which a spin-polarized metal state is generated on a surface thereof. In a topological insulator, an internal magnetic field is generated due to a spin-orbit interaction. In a topological insulator, a new topological phase develops due to the effect of a spin-orbit interaction even if there is no external magnetic field. A topological insulator can generate a pure spin current with high efficiency due to a strong spin-orbit interaction and breaking of inversion symmetry at an edge.

For example, a topological insulator is made of SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, or the like. A topological insulator can generate a spin current with high efficiency.

For example, the first end of the wiring 20 is connected to the drain D of the second switching element Sw2 via the first electrode E1 and the via wiring V3. For example, the second end of the wiring 20 is connected to the source line SL via the second electrode E2 and the via wiring V5.

Each of the first electrode E1 and the second electrode E2 is connected to the wiring 20. A pillar body P is provided between the first electrode E1 and the second electrode E2, and the first electrode E1 and the second electrode E2 are not directly connected to each other. The pillar body P is laminated on a portion of the wiring 20. In the wiring 20, at least two different places are not covered by the pillar body P and are exposed. The first electrode E1 is connected to one of the exposed parts in the wiring 20, and the second electrode E2 is connected to the other of the exposed parts in the wiring 20. The first electrode E1 and the second electrode E2 are electrically connected to each other via the wiring 20. The pillar body P is an insulator. For example, the pillar body P is formed of a material similar to those of the insulating layers 90, 92, 93, 94, and 95. The first electrode E1 and the second electrode E2 are formed of a material having excellent conductivity. For example, the first electrode E1 and the second electrode E2 include any one selected from the group consisting of Ag, Cu, Co, Al, and Au.

For example, the first electrode E1 and the second electrode E2 may include an underlayer UL which comes into contact with the wiring 20. The underlayer UL enhances adhesion of the first electrode E1 and the second electrode E2 to the wiring 20. In addition, the underlayer UL curbs migration between elements due to heating treatment or the like at the time of processing. For example, the underlayer UL includes the same material as the wiring 20. For example, the underlayer UL is made of tungsten.

An insulating layer 91 is provided between the first electrode E1 and the second electrode E2, and the laminate 10. The insulating layer 91 electrically separates the laminate 10, and the first electrode E1 and the second electrode E2 from each other. For example, the insulating layer 91 is formed of a material similar to those of the insulating layers 90, 92, 93, 94, and 95. The insulating layer 91 covers a lateral side surface of the laminate 10. For example, the first electrode E1 and the second electrode E2 are provided on the insulating layer 91.

For example, the widths of the first electrode E1 and the second electrode E2 in the x direction are wider than the width of a part exposed from the pillar body P of the wiring 20. Although it is difficult to connect the via wiring to a part exposed from the pillar body P of the wiring 20, electrical connection between the first electrode E1 and the via wiring V3 and electrical connection between the second electrode E2 and the via wiring V5 can be easily performed due to the wide widths of the first electrode E1 and the second electrode E2 in the x direction.

For example, the first electrode E1 is connected to the via wiring V3, and for example, the second electrode E2 is connected to the via wiring V5 (refer to FIG. 5). The via wiring V3 is an example of a first via wiring, and the via wiring V5 is an example of a second via wiring. The via wiring V3 comes into contact with the lateral side surface of the first electrode E1. The via wiring V5 is provided on an inward side of the second electrode E2. If a contact surface between the via wiring V3 and the first electrode E1 and a contact surface between the via wiring V5 and the second electrode E2 are large, electrical connection in interfaces therebetween becomes strong.

Next, an example of a method for manufacturing the integrated area IA of the magnetic array 200 according to the first embodiment will be described. The integrated area IA is formed through a lamination step for each of the layers, and a processing step of processing a portion of each of the layers in a predetermined shape. A sputtering method, a chemical vapor deposition (CVD) method, an electron beam deposition method (EB deposition method), an atom laser deposition method, or the like can be used for laminating each of the layers. Each of the layers can be processed using photolithography or the like. FIGS. 8 to 13 are cross-sectional views for describing a method for manufacturing a magnetic array according to the first embodiment. FIGS. 8 to 13 are cross-sections along line A-A in FIG. 4.

Figure 8:
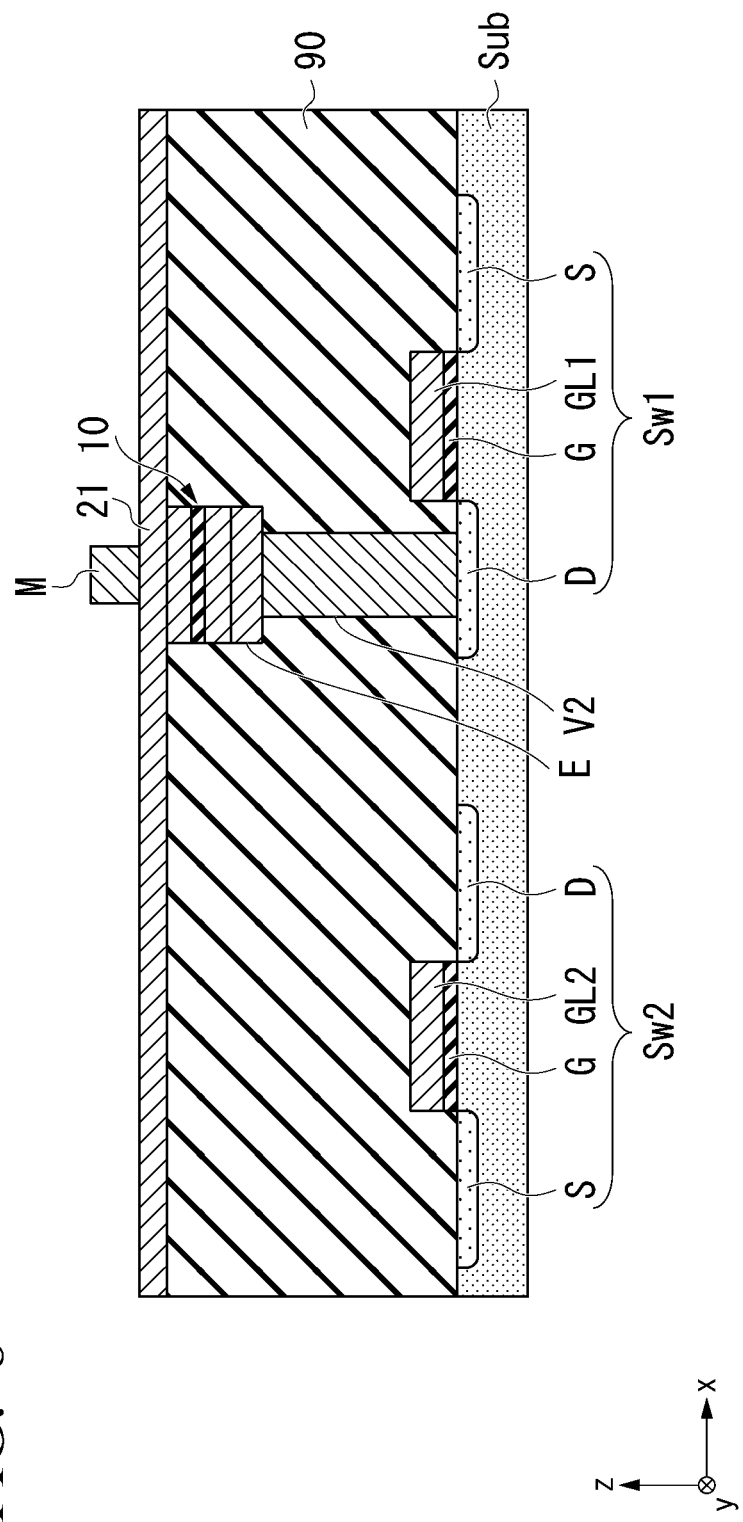
FIG. 8 is a cross-sectional view for describing a method for manufacturing a magnetic array according to the first embodiment.

First, as illustrated in FIG. 8, the first switching element Sw1 and the second switching element Sw2 are produced at predetermined positions on the substrate Sub. The first switching element Sw1 and the second switching element Sw2 can be produced by a known method. In addition, a substrate Sub in which the first switching element Sw1 and the second switching element Sw2 are formed may be purchased.

Next, the insulating layer 90 is laminated on the substrate Sub. Further, an opening is formed at a position overlapping the drain D of the first switching element Sw1 of the insulating layer 90. The inside of the opening is filled with a conductor, which will serve as the via wiring V2. Thereafter, the electrode E, the first ferromagnetic layer 1, the non-magnetic layer 3, and the second ferromagnetic layer 2 are laminated in order and are processed in predetermined shapes; and thereby, the laminate 10 is formed. For example, the range of the laminate 10 is covered with the insulating layer 90.

Next, surfaces of the insulating layer 90 and the second ferromagnetic layer 2 are flattened, for example, by chemical-mechanical polishing (CMP), and a wiring 21 is laminated thereon. Moreover, a mask M is formed at a predetermined position on the wiring 21. The mask M is formed of an inorganic substance. For example, the mask M is formed of silicon. The mask M is removed by post-treatment.

Figure 9:
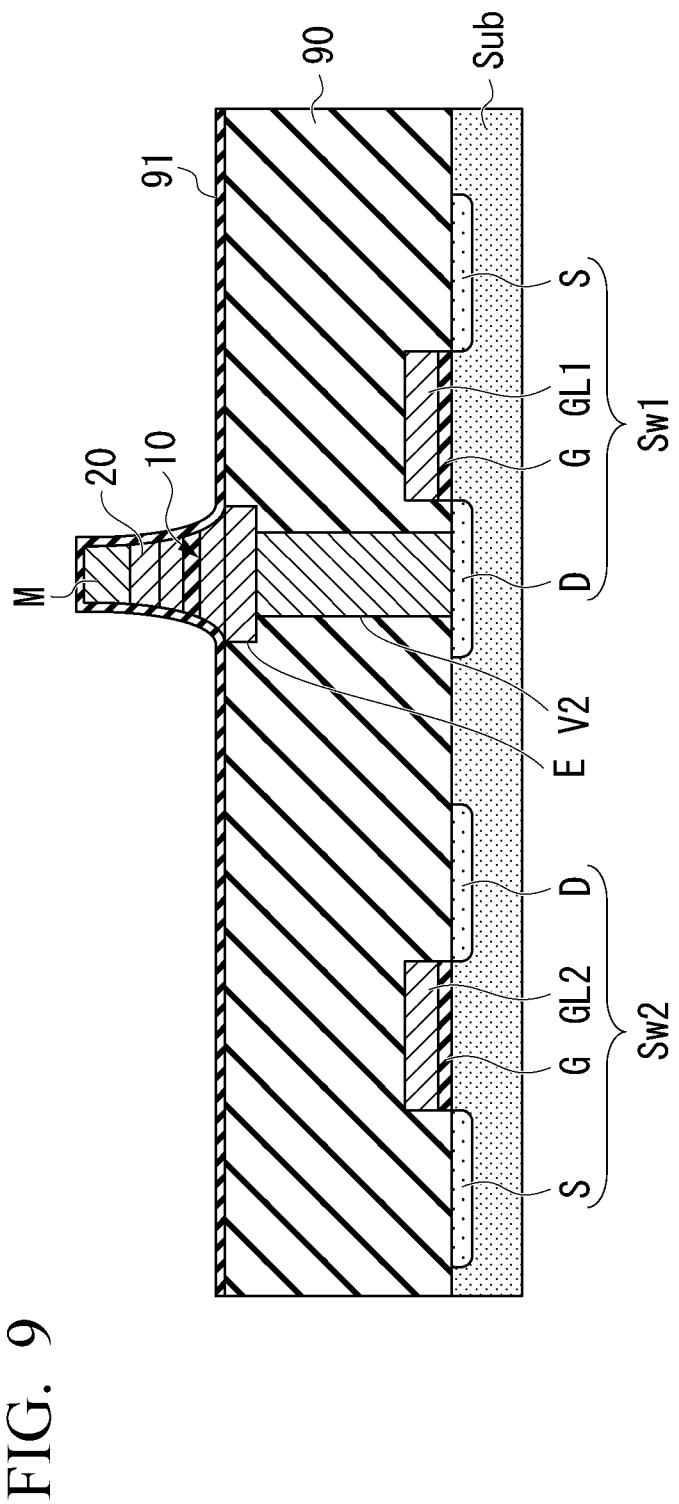
FIG. 9 is a cross-sectional view for describing the method for manufacturing a magnetic array according to the first embodiment.

Next, as illustrated in FIG. 9, portions of the wiring 21 and the laminate 10 are etched with the mask M therebetween. For example, regarding etching, etching is performed using an ion beam. The lateral side surface of the laminate 10 is inclined with respect to the z direction due to etching. The wiring 21 becomes the wiring 20 through etching. Further, film formation of the insulating layer 91 is performed such that the laminate 10, the wiring 20, and the mask M are covered. For example, the insulating layer 91 covers the lateral side surfaces of the laminate 10 and the wiring 20. Next, the mask M is lifted off, and the mask M and the insulating layer 91 formed on the mask M are removed. After the mask M is lifted off, an upper surface of the wiring 20 is exposed.

Figure 10:
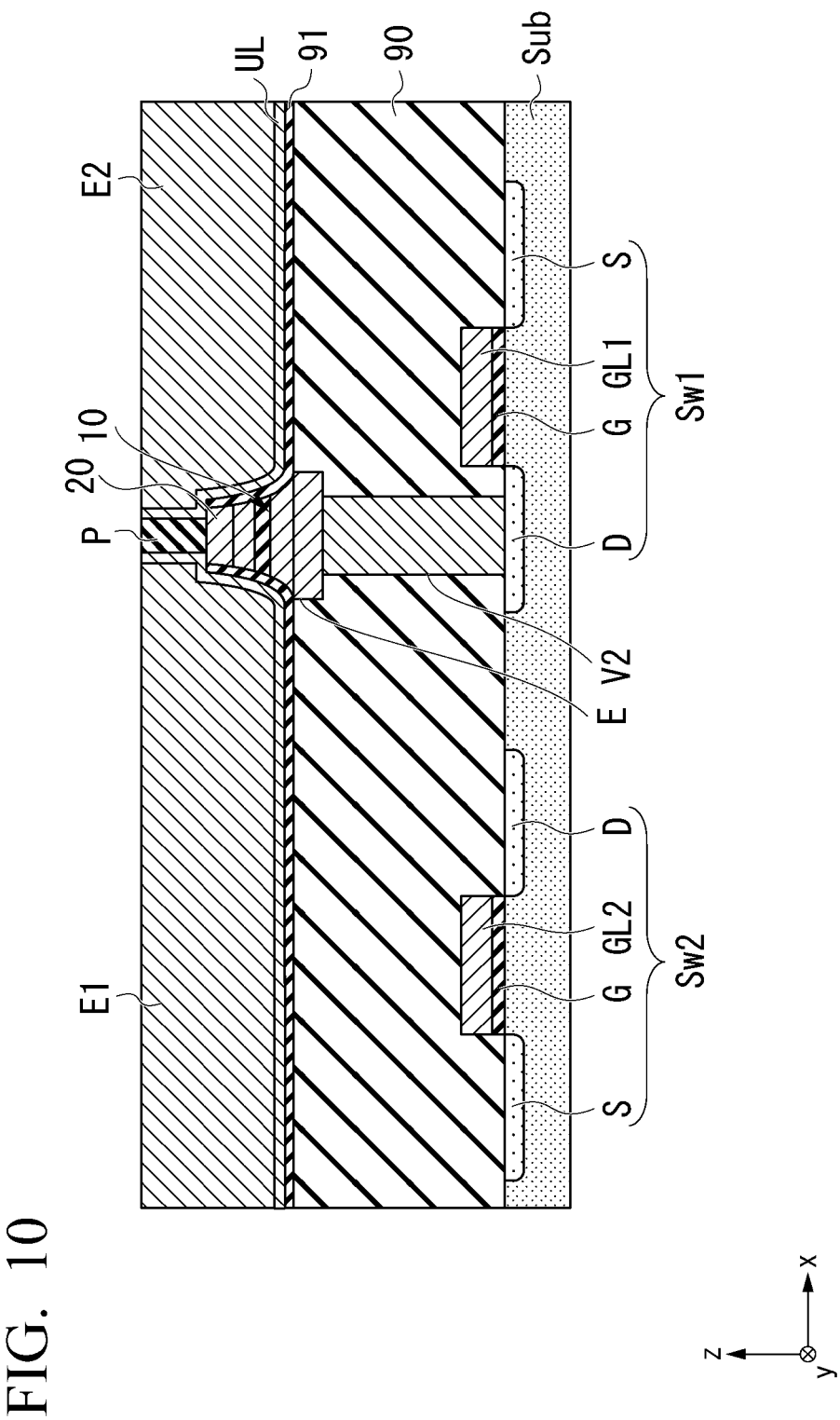
FIG. 10 is a cross-sectional view for describing the method for manufacturing a magnetic array according to the first embodiment.

Next, as illustrated in FIG. 10, the pillar body P is formed such that two different points in the wiring 20 are exposed. Next, the underlayer UL and a conductive layer are laminated such that the insulating layer 91, the exposed parts in the wiring 20, and the pillar body P are covered. Thereafter, the first electrode E1 and the second electrode E2 are formed by removing the underlayer UL and the conductive layer laminated above the upper surface of the pillar body P.

Figure 11:
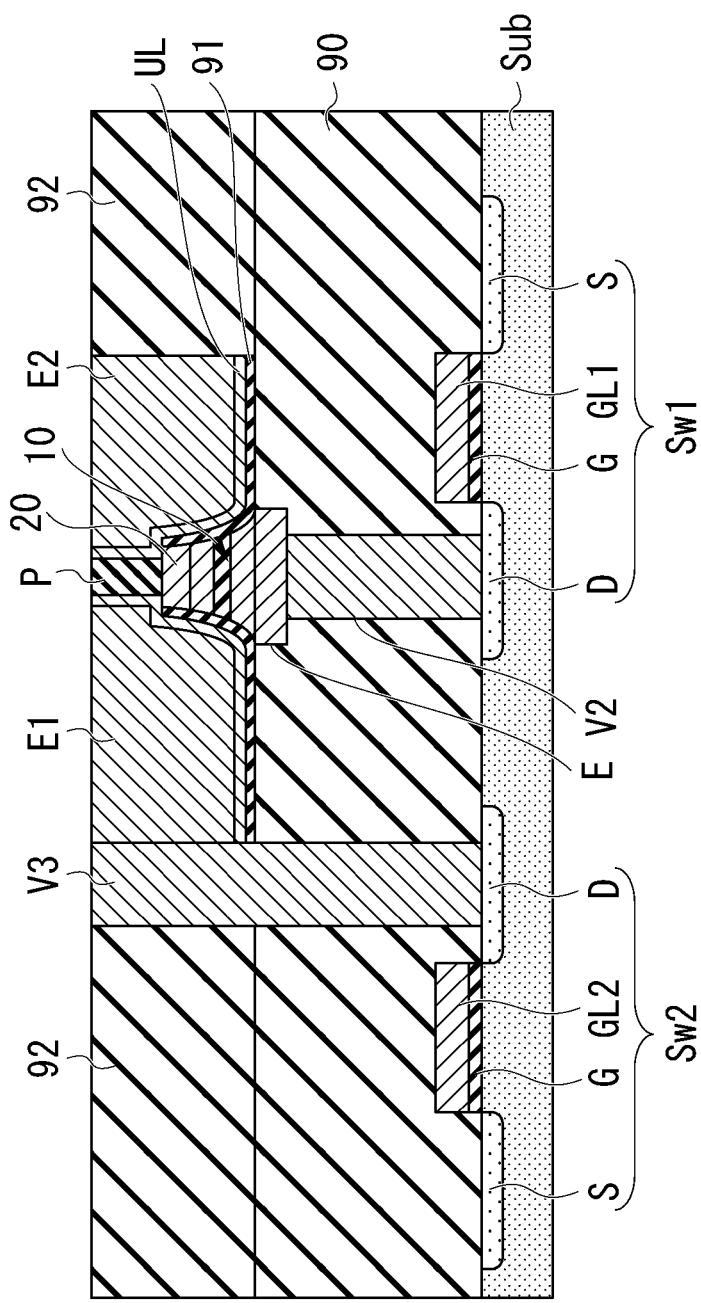
FIG. 11 is a cross-sectional view for describing the method for manufacturing a magnetic array according to the first embodiment.

Next, as illustrated in FIG. 11, unnecessary parts of the first electrode E1 and the second electrode E2 are removed, and the removed parts are covered with the insulating layer 92. Further, an opening is formed in the insulating layer 92 at a position overlapping the drain D of the second switching element Sw2. The inside of the opening is filled with a conductor, which will serve as the via wiring V3. For example, the via wiring V3 comes into contact with the lateral side surface of the first electrode E1. The via wiring V3 may be formed to penetrate the inside of the first electrode E1.

Figure 12:
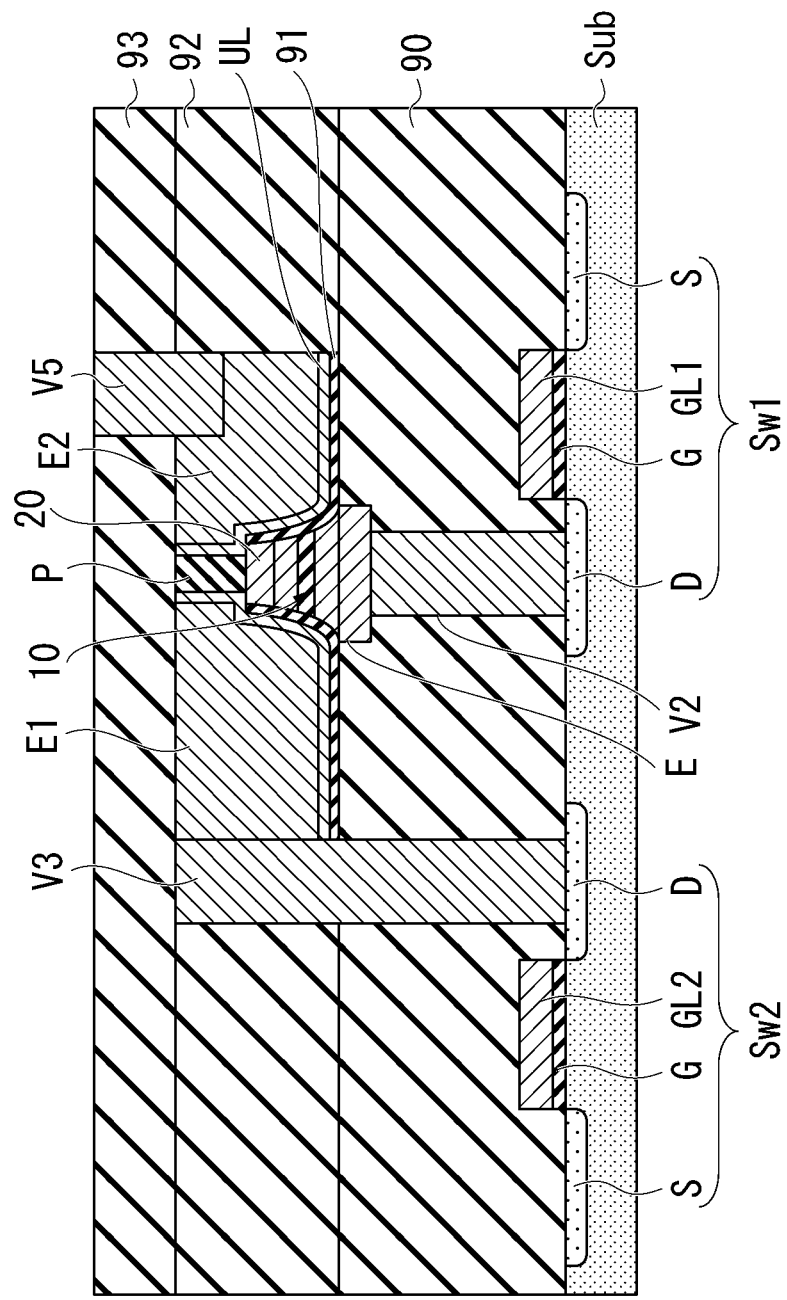
FIG. 12 is a cross-sectional view for describing the method for manufacturing a magnetic array according to the first embodiment.

Next, as illustrated in FIG. 12, the insulating layer 93 is laminated on the first electrode E1, the second electrode E2, and the insulating layer 92. Further, an opening is formed in the insulating layer 93 at a position overlapping the second electrode E2. For example, the opening is formed to the inside of the second electrode E2. The inside of the opening is filled with a conductor, which will serve as the via wiring V5. After the opening is formed to the inside of the second electrode E2, the via wiring V5 is formed on the inward side of the second electrode E2.

Figure 13:
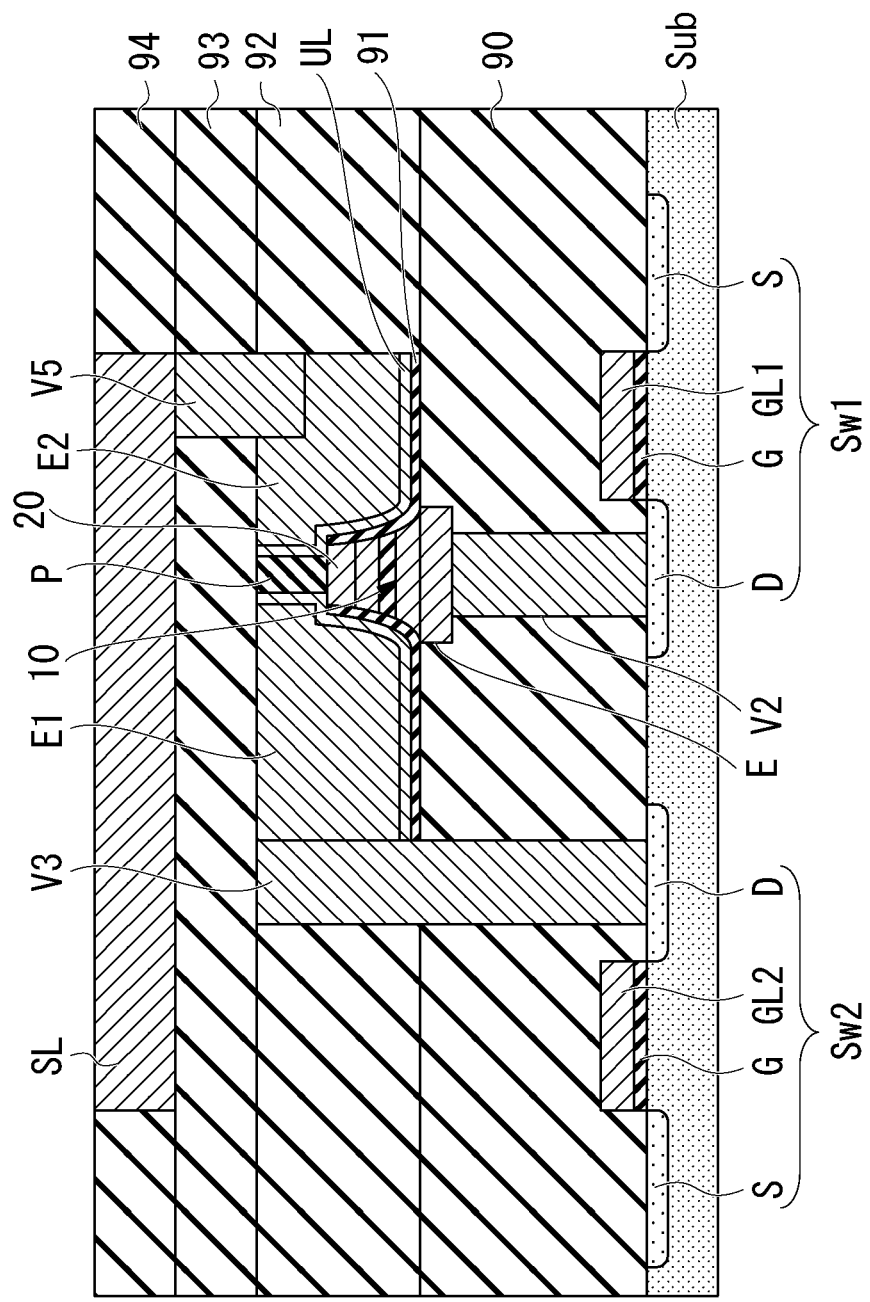
FIG. 13 is a cross-sectional view for describing the method for manufacturing a magnetic array according to the first embodiment.

Next, as illustrated in FIG. 13, the insulating layer 94 is laminated on the insulating layer 93 and the via wiring V5. Further, a portion of the insulating layer 94 is removed, and the source line SL is formed at the removed part.

Next, the insulating layer 95 is laminated on the insulating layer 94 and the source line SL. Further, an opening is formed in the insulating layer 95 at a position overlapping the source S of the first switching element Sw1. The inside of the opening is filled with a conductor, which will serve as the via wiring V1. Further, the first read line RL1 and the second read line RL2 are formed at positions overlapping the via wiring V1 on the insulating layer 95 and the via wiring V1. Through the foregoing procedure, the magnetic array 200 illustrated in FIG. 5 is formed.

In the magnetic array 200 according to the present embodiment, since the first ferromagnetic layer 1 of the laminate 10 is on the substrate Sub side, it can be connected to the switching element by only the via wiring V2 extending in the z direction, and thus routing of the wiring is simplified. In addition, since the wiring 20 is provided on the laminate 10, electrical connection between the wiring 20, and the first electrode E1 and the second electrode E2 can be easily secured. Moreover, since the first electrode E1 and the second electrode E2 are formed to be wider than the parts of the wiring 20 exposed from the pillar body P, the via wirings V3 and V5 are easily produced.

In addition, since the first unit U1 and the second unit U2 are alternately arrayed, integration efficiency of the units inside the integrated area IA can be enhanced.

Figure 14:
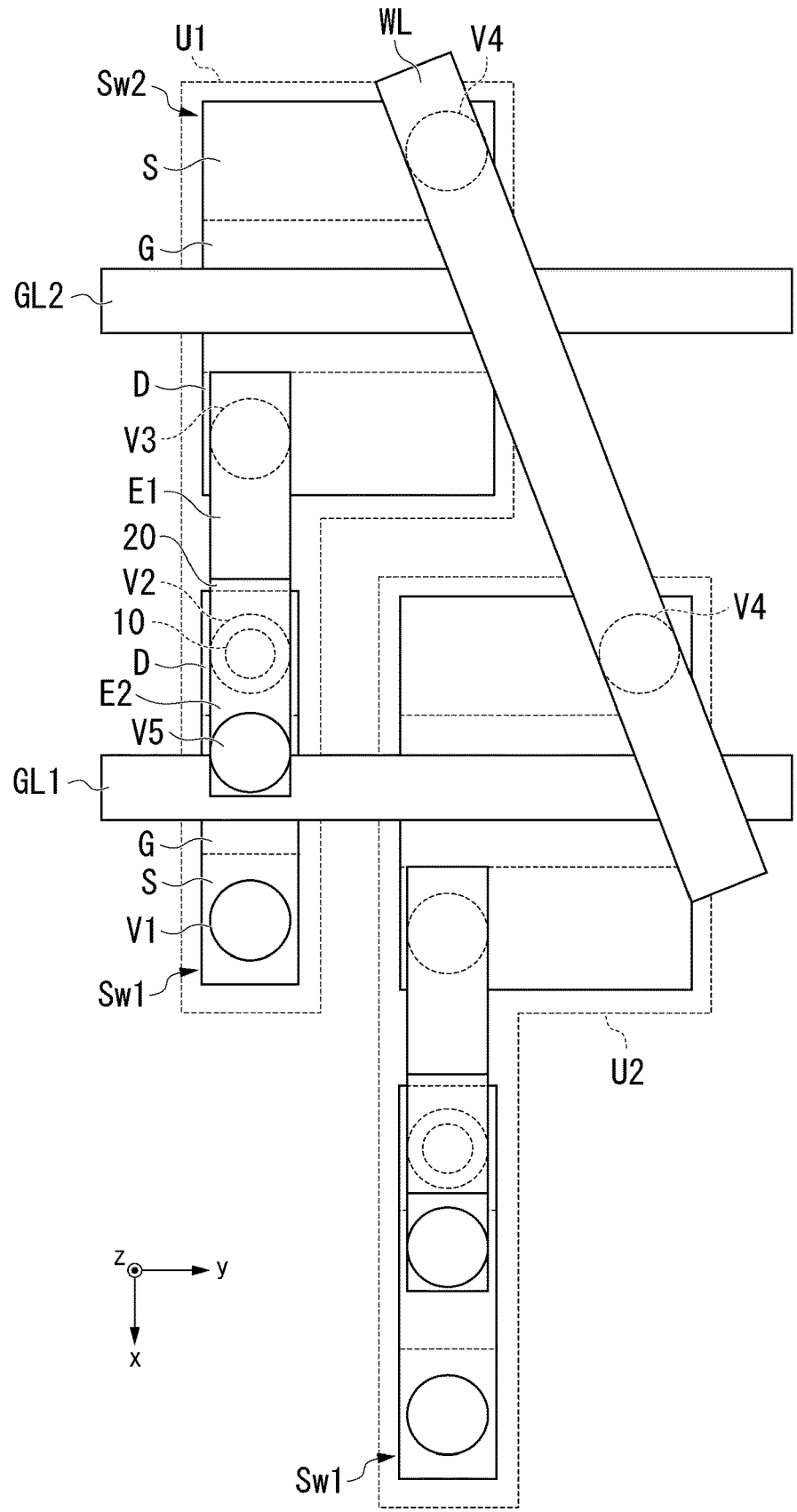
FIG. 14 is a plan view of a portion of a magnetic array according to a first modification example.

The first embodiment has been described so far as an example, but the present invention is not limited to this example. For example, FIG. 14 is a plan view of a portion of a magnetic array according to a first modification example. In the magnetic array according to the first modification example, the first unit U1 and the second unit U2 are differently disposed. In the magnetic array according to the first modification example, similar reference signs are applied to constitutions similar to those in FIG. 4.

In the magnetic array according to the first modification example, the second switching element Sw2 of the second unit U2 is provided on the lateral side of the first switching element Sw1 of the first unit U1. The first unit U1 and the second unit U2 have a positional relationship in which the first switching element Sw1 and the second switching element Sw2 are the same. For example, the word line WL is not orthogonal to the first gate line GL1 and the second gate line GL2 but intersects them. A part of the second unit U2 having a wide width in the y direction is fitted to a part of the first unit U1 having a narrow width in the y direction, and thus integration efficiency of the first unit U1 and the second unit U2 increases.

Second Embodiment

Figure 15:
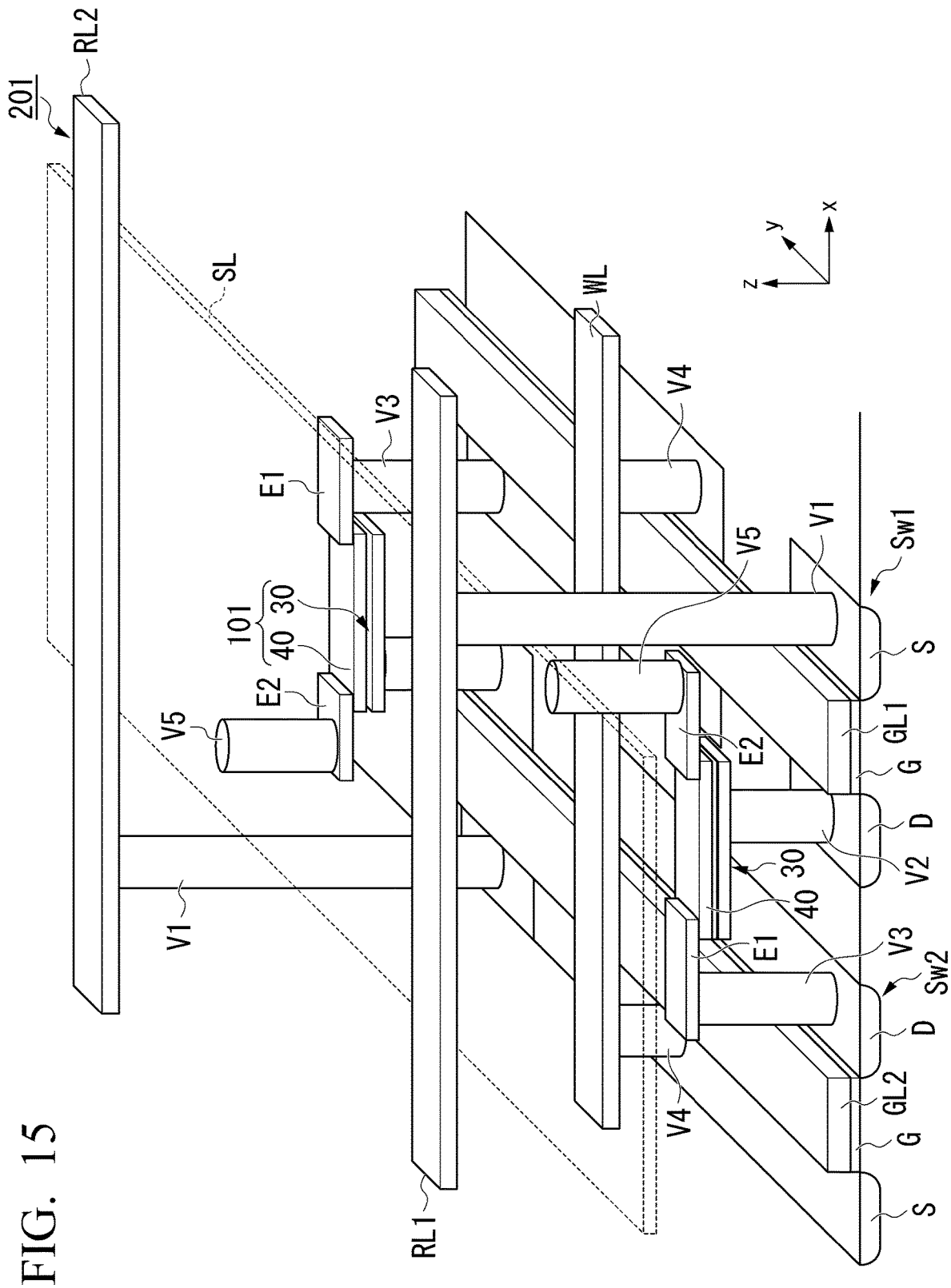
FIG. 15 is a perspective view of a portion of a magnetic array according to a second embodiment.
Figure 16:
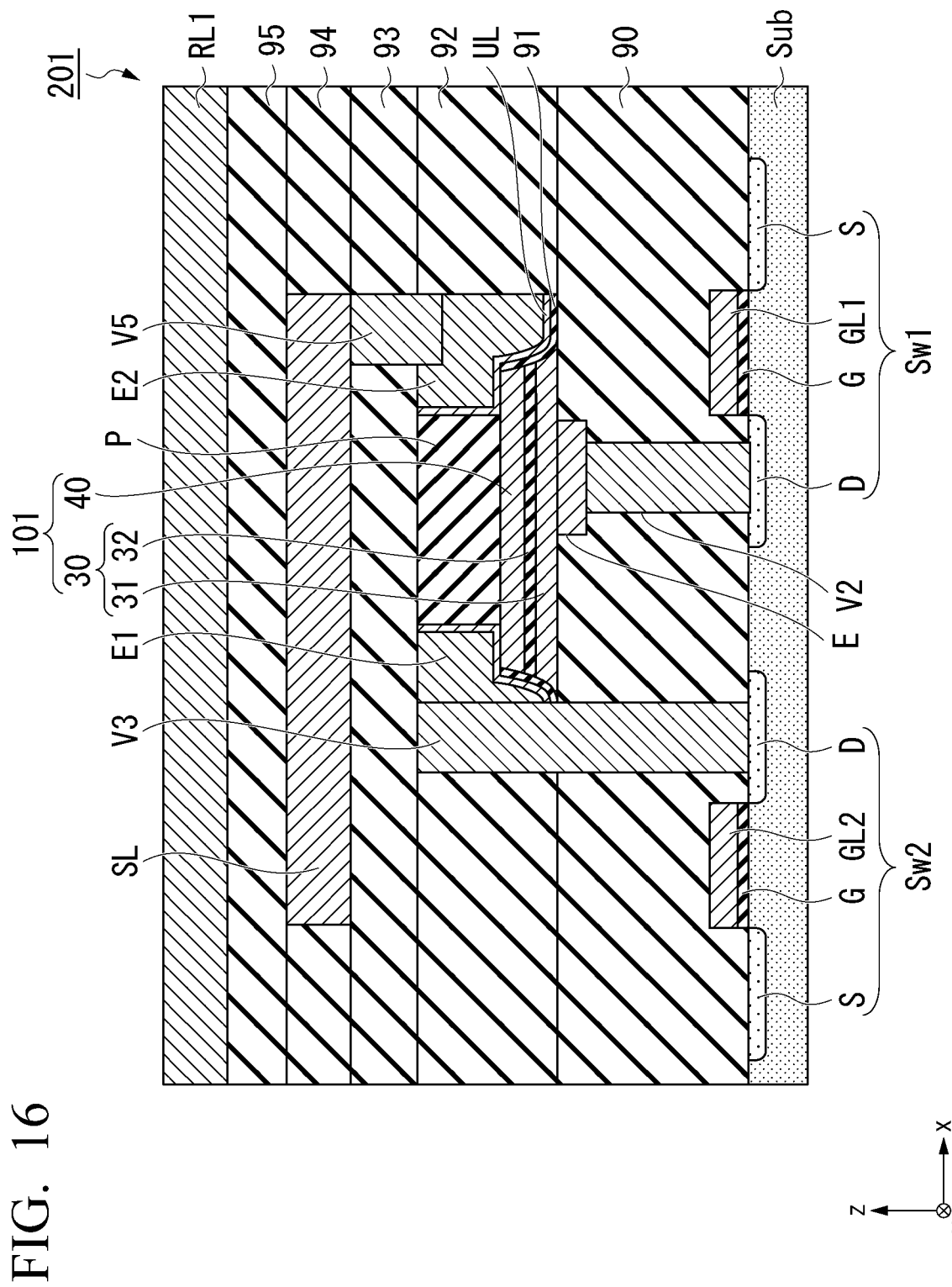
FIG. 16 is a cross-sectional view of a portion of the magnetic array according to the second embodiment.

FIG. 15 is a perspective view of a portion of a magnetic array 201 according to a second embodiment. In FIG. 15, the source line SL is indicated by dotted lines such that the internal structure can be easily seen. FIG. 16 is a cross-sectional view of a portion of the magnetic array 201 according to the second embodiment. In FIGS. 15 and 16, the first switching element Sw1 and the second switching element Sw2 are field effect transistors.

In the magnetic array 201 according to the second embodiment, the constitution of a magnetoresistance effect element 101 differs from the magnetoresistance effect element 100 according to the first embodiment. In FIGS. 15 and 16, similar reference signs are applied to constitutions similar to those in the first embodiment, and description thereof will be omitted.

The magnetoresistance effect element 101 includes a laminate 30 and a wiring 40. The laminate 30 includes a first ferromagnetic layer 31 and a non-magnetic layer 32 in order from a substrate Sub side. The magnetoresistance effect element 101 is an element of which the resistance value varies due to movement of a magnetic domain wall and may be referred to as a magnetic domain wall movement element, a magnetic domain wall displacement type magnetoresistance effect element.

The wiring 40 is a magnetic layer. The wiring 40 includes a ferromagnetic substance. Regarding a magnetic substance constituting the wiring 40, a metal selected from the group consisting of Cr, Mn, Co, Fe, and Ni, an alloy including one or more of these metals, an alloy including these metals and at least one or more elements of B, C, and N, or the like can be used. Specifically, examples thereof can include Co—Fe, Co—Fe—B, and Ni—Fe.

The wiring 40 is a layer which can perform magnetic recording of information due to change in the internal magnetic state. The wiring 40 has a first magnetic domain and a second magnetic domain in the x direction. For example, the magnetization of the first magnetic domain and the magnetization of the second magnetic domain are oriented in directions opposite to each other. The boundary between the first magnetic domain and the second magnetic domain in the x direction becomes a magnetic domain wall. The wiring 40 can internally have a magnetic domain wall.

The magnetoresistance effect element 101 can record data in a multi-valued manner or a consecutive manner depending on the position of the magnetic domain wall of the wiring 40. Data recorded in the wiring 40 is read as change in the resistance value of the magnetoresistance effect element 101 when a read current is applied.

The magnetic domain wall travels by causing a write current to flow in the x direction of the wiring 40 or applying an external magnetic field. For example, if a write current (for example, a current pulse) is applied in a positive x (+x) direction of the wiring 40, since electrons flow in a negative x (−x) direction that is opposite to that of the current, the magnetic domain wall travels in the negative x (−x) direction. When a current flows from the first magnetic domain toward the second magnetic domain, electrons which have been spin-polarized in the second magnetic domain cause a magnetization reversal of the magnetization of the first magnetic domain. The magnetic domain wall travels in the negative x (−x) direction due to a magnetization reversal of the magnetization of the first magnetic domain.

Each of the first ferromagnetic layer 31 and the non-magnetic layer 32 is similar the first ferromagnetic layer 1 and the non-magnetic layer 3 according to the first embodiment.

The magnetic array 201 according to the second embodiment differs only in the constitution of the magnetoresistance effect element 101 and can achieve effects similar to those of the magnetic array 200 according to the first embodiment. The magnetic array 201 according to the second embodiment can be applied to a neuromorphic device. A neuromorphic device is an element which imitates the human brain by a neural network. A neuromorphic device artificially imitates a relationship between neurons and synapses in the human brain.

For example, a neuromorphic device includes chips (neurons in the brain) disposed in a layered state and transmission parts (synapses in the brain) connecting the chips to each other. A neuromorphic device raises the percentage of correct answers to questions through learning of the transmission parts (synapses). In learning, knowledge which may be able to be used in the future is found from information, and a neuromorphic device weights input data.

Each synapse mathematically performs multiply-accumulate calculation. In the magnetic array 201 according to the second embodiment, the magnetoresistance effect elements 101 are arrayed in an array shape, and thus multiply-accumulate calculation can be performed. For example, when a current flows in a read path of the magnetoresistance effect element, the product of the input current and the resistance of the magnetoresistance effect element is output; and thereby, multiple calculation is performed. If a plurality of magnetoresistance effect elements are connected using a common wiring, multiple calculation is added through the common wiring, and accumulate calculation is performed. Therefore, the magnetic array according to the second embodiment can be applied to a neuromorphic device as a multiply-accumulate calculation device.

EXPLANATION OF REFERENCE SIGNS

1, 31 First ferromagnetic layer
2 Second ferromagnetic layer
3, 32 Non-magnetic layer
10, 30 Laminate
20, 21, 40 Wiring
90, 91, 92, 93, 94, 95 Insulating layer
100, 101 Magnetoresistance effect element
200, 201 Magnetic array
CP Comparison unit
CT Control part
E1 First electrode
E2 Second electrode
GL1 First gate line
GL2 Second gate line
IA Integrated area
M Mask
OP Calculation unit
P Pillar body
PA Peripheral area
PS Power supply
R1 First region
R2 Second region
RL1 First read line
RL2 Second read line
SL Source line
Sw1 First switching element
Sw2 Second switching element
Sw3 Third switching element
Sw4 Fourth switching element
U1 First unit
U2 Second unit
UL Underlayer
V1, V2, V3, V4, V5 Via wiring
WL Word line

What is claimed is:

1. A magnetic array comprising:
a substrate;
a first unit;
a second unit;
a word line;
a first read line;
a second read line;
a first gate line;
a second gate line; and
a source line,
wherein each of the first unit and the second unit includes a magnetoresistance effect element, a first switching element, and a second switching element,
wherein the magnetoresistance effect element includes a laminate and a wiring provided on the laminate,
wherein the laminate includes at least a reference layer and a non-magnetic layer in order from a substrate side,
wherein the first switching element of the first unit is connected to the reference layer of the first unit and the first switching element of the second unit is connected to the reference layer of the second unit,
wherein the second switching element of the first unit is connected to the wiring of the first unit, and the second switching element of the second unit is connected to the wiring of the second unit,
wherein the first read line is connected to the first switching element of the first unit, the first read line being configured to conduct a read current when data is read from the magnetoresistance effect element,
wherein the second read line is connected to the first switching element of the second unit, the second read line being configured to conduct the read current when data is read from the magnetoresistance effect element,
wherein the word line is connected to the second switching elements of the first unit and the second unit, the word line being configured to conduct a write current when data is written to the magnetoresistance effect element,
wherein the first gate line is connected to a gate of the first switching element of the first unit and a gate of the second switching element of the second unit, the first gate line being configured to control ON/OFF operation of the first switching element and the second switching element,
wherein the second gate line is connected to a gate of the second switching element of the first unit and a gate of the first switching element of the second unit, the second gate line being configured to control ON/OFF operation of the first switching element and the second switching element, and
wherein the source line is connected to the wiring of the first unit and the wiring of the second unit, the source line being configured to conduct the read current and the write current.

2. The magnetic array according to claim 1 further comprising:
a comparison unit that is connected to the first read line and the second read line.

3. The magnetic array according to claim 1,
wherein a width of the gate of the first switching element is narrower than a width of the gate of the second switching element.

4. The magnetic array according to claim 1,
wherein the first switching element of the first unit and the second switching element of the second unit are adjacent to each other, and wherein the second switching element of the first unit and the first switching element of the second unit are adjacent to each other.

5. The magnetic array according to claim 1 further comprising:
an insulating layer that covers a lateral side surface of the laminate; and
a first electrode and a second electrode that are provided on the insulating layer,
wherein the first electrode and the second electrode are electrically connected to each other via the wiring.

6. The magnetic array according to claim 5,
wherein each of the first electrode and the second electrode includes an underlayer which comes into contact with the wiring.

7. The magnetic array according to claim 6,
wherein the underlayer includes the same material as the wiring.

8. The magnetic array according to claim 5 further comprising:
a first via wiring that is connected to the first electrode; and
a second via wiring that is connected to the second electrode,
wherein the first via wiring is provided on an inward side of the first electrode or comes into contact with a lateral side surface of the first electrode, and
wherein the second via wiring is provided on an inward side of the second electrode or comes into contact with a lateral side surface of the second electrode.

9. The magnetic array according to claim 1,
wherein the laminate includes—the reference layer, the non-magnetic layer, and a free layer in order from a substrate side.

10. The magnetic array according to claim 1,
wherein the wiring includes a magnetic layer internally including a magnetic domain wall, and
wherein the laminate consists of the reference layer and the non-magnetic layer in order from a substrate side.

* * * * *